United States Patent
Watanabe et al.

(10) Patent No.: US 8,010,739 B2
(45) Date of Patent: Aug. 30, 2011

(54) ELECTRONIC DEVICE AND PROGRAM FOR OPERATING THE SAME

(75) Inventors: Yoshinori Watanabe, Chita-gun (JP); Tomoya Imagawa, Anjo (JP); Yuki Nakai, Nagoya (JP); Makoto Ono, Kariya (JP); Takemi Ueno, Okazaki (JP); Hiroki Tanaka, Takahama (JP)

(73) Assignee: DENSO CORPORATION, Kariya (JP)

( * ) Notice: Subject to any disclaimer, the term of this patent is extended or adjusted under 35 U.S.C. 154(b) by 432 days.

(21) Appl. No.: 12/238,791

(22) Filed: Sep. 26, 2008

(65) Prior Publication Data

US 2009/0144489 A1 Jun. 4, 2009

(30) Foreign Application Priority Data

Sep. 28, 2007 (JP) ................................ 2007-255129
Jun. 18, 2008 (JP) ................................ 2008-159086
Sep. 22, 2008 (JP) ................................ 2008-243166

(51) Int. Cl.
*G06F 13/00* (2006.01)
*G06F 13/28* (2006.01)
*G06F 9/00* (2006.01)
*G06F 7/00* (2006.01)
*G06F 17/00* (2006.01)

(52) U.S. Cl. ............... 711/103; 711/154; 711/E12.001; 713/1; 707/609; 707/687

(58) Field of Classification Search ................. 711/103, 711/154, E12.001; 713/1; 707/609, 687
See application file for complete search history.

(56) References Cited

U.S. PATENT DOCUMENTS

| 5,732,092 A | 3/1998 | Shinohara |
| 6,438,056 B2 | 8/2002 | Aue |
| 6,636,937 B2 | 10/2003 | Peter |
| 6,809,893 B2 | 10/2004 | Uzumaki et al. |
| 2002/0021599 A1* | 2/2002 | Peter .............................. 365/200 |
| 2008/0234932 A1* | 9/2008 | Lee ................................. 701/213 |
| 2009/0268502 A1* | 10/2009 | Miura et al. ..................... 365/63 |

FOREIGN PATENT DOCUMENTS

| JP | 06-28246 A | 2/1994 |
| JP | 08-147988 A | * 6/1995 |
| JP | 08-147988 A | 6/1996 |
| JP | 08-279295 A | * 10/1996 |
| JP | 08-279295 A | 10/1996 |

(Continued)

OTHER PUBLICATIONS

Notice of Rejection mailed on Feb. 23, 2010 issued from the Japanese Patent Office in the corresponding Japanese patent application No. 2008-243166 (and English translation).

*Primary Examiner* — Edward J Dudek, Jr.
(74) *Attorney, Agent, or Firm* — Posz Law Group, PLC

(57) ABSTRACT

A navigation device realizes such processing as map display and route guidance based on map data stored in a memory card. The data in the memory card tends to be volatilized with an increase in the frequency of reading of data. Therefore, the data that are highly frequently read out are held in a RAM so as to be read from the memory card at a decreased frequency. Further, the passage of time is calculated from the date and hour the data are recorded in the memory card, and the whole data in the memory card are refreshed every time when the passage of time exceeds a threshold value T1.

17 Claims, 18 Drawing Sheets

FOREIGN PATENT DOCUMENTS

| | | | |
|---|---|---|---|
| JP | 10-21693 A | 1/1998 |
| JP | 2000-11670 A | 1/2000 |
| JP | 2002-055885 A | * | 2/2002 |
| JP | A-2002-055885 | 2/2002 |
| JP | 2003-002132 | * | 1/2003 |
| JP | A-2003-002132 | 1/2003 |
| JP | 2005-78489 A | 3/2005 |
| JP | 2006-301993 A | 11/2006 |

* cited by examiner

ELECTRONIC DEVICE AND PROGRAM FOR OPERATING THE SAME

CROSS REFERENCE TO RELATED APPLICATION

The present application is based on and incorporates herein by reference Japanese Patent Applications No. 2007-255129 filed on Sep. 28, 2007, No. 2008-159086 filed on Jun. 18, 2008 and No. 2008-243166 filed on Sep. 22, 2008.

FIELD OF THE INVENTION

This invention relates to an electronic device which reads data from an electrically data-rewritable nonvolatile memory such as flash memory and executes processing based on the data.

BACKGROUND OF THE INVENTION

A flash memory is known as an electrically data-rewritable nonvolatile memory. In recent years, a flash memory of a large capacity has been successfully developed by so forming memory cells as to possess a multiplicity of values, and the storage capacity of the flash memory is becoming comparable to storage capacities of hard disk devices.

In recent years, therefore, it has been proposed to configure a personal computer, a car navigation device and the like by using a multi-value flash memory of a large capacity as a storage medium instead of using a hard disk device that has been used so far.

In an electronic device such as a car navigation device used in an environment of vigorous vibration, use of a flash memory or the like in place of a hard disk device reduces physical crash and provides an advantage of preventing trouble caused by vibration.

As compared with other storage media such as a binary flash memory or a hard disk device, however, the multi-value flash memory has a low data storage (retention) capability and, therefore, is inferior in storing the data for extended periods of time.

If exposed to high temperatures, the flash memory tends to decrease the retention as is widely known. If the frequency of writing increases, further, the flash memory sharply decreases the retention with a given frequency as a boundary. As the frequency of reading the data increases, further, the data held by the memory cells in the flash memory become highly probable to be volatilized.

The multi-value flash memory tends to develop the above problem as compared with the conventional binary flash memories. If the multi-value flash memory is employed as a storage medium in the personal computer, the car navigation device or the like, then it is expected that trouble might occur due to the volatilization of data.

To cope with the volatilization of data, it is known to refresh the data stored in the nonvolatile memory by once reading out the data stored in the nonvolatile memory (flash memory, etc.) and writing the data again (JP 2005-78489A, JP 2006-301993A).

According to this refreshing method, a nonvolatile memory is provided with a circuit for detecting the state of the memory cells to thereby check if refreshing is necessary. Therefore, provision of the circuit increases the cost; i.e., volatilization of data cannot be easily and inexpensively suppressed.

Besides, in order to suppress the effect of a decreased retention caused by the external environment, the data is refreshed at a moment when a physical quantity (temperature, etc.) representing the external environment exceeds a threshold value. To suppress the volatilization of data when, for example, the temperature is high according to the above method, however, the data is refreshed at a moment when the temperature exceeds the threshold value without taking the time of exposure to high temperature into consideration. Therefore, the data cannot be refreshed at a suitable timing (necessary and sufficient timing) at all times.

In the flash memory, in particular, the retention decreases depending upon the frequency of writing. Therefore, the refreshing that is unnecessarily executed shortens the life of the nonvolatile memory (flash memory).

SUMMARY OF THE INVENTION

The present invention is accomplished in view of the above problems, and has an object of providing a technology that is capable of suppressing the volatilization of data easily and suitably.

According to the present invention, an electronic device is connected to an electrically data-rewritable nonvolatile memory (flash memory, etc.) into which predetermined data are written in advance, and executes processing based on the data stored in the nonvolatile memory. For example, when the electronic device is a map display device such as a car navigation device, the electronic device displays a map screen for displaying a map around the present position based on the map data stored in the nonvolatile memory. The electronic device includes a memory for temporarily storing the data stored in the nonvolatile memory, and updates the data to refresh the data stored in the nonvolatile memory. That is, to update the data, data update processing is executed as follows: the data stored in the nonvolatile memory are read out from the nonvolatile memory, once stored in the temporary memory, and the data are updated to be written again into the nonvolatile memory.

The electronic device executes the update control for controlling executing the data update processing and estimates the passage of time after the writing. The update control executes the data update processing every time if a threshold value is exceeded by the passage of time after the writing estimated by the passage of time after writing estimation. On the other hand, in the estimation of the passage of time after the writing, the passage of time after the writing is estimated from a moment when the data to be stored in the nonvolatile memory are written into the nonvolatile memory.

Namely, the electronic device refreshes the data stored in the nonvolatile memory every time when it is estimated that the threshold value is exceeded by the passage of time from a moment when the data to be stored in the nonvolatile memory are written into the nonvolatile memory.

As is well known, the data stored in the nonvolatile memory tend to be volatilized with an increase in the frequency of reading or an increase in the time exposed to high temperatures. The occurrence of data volatilization due to the above causes is correlated to the passage of time from a moment the data are written into the nonvolatile memory.

Therefore, if the passage of time after the writing of data is estimated and the timing for executing the data updating processing is controlled based on the passage of time that is estimated, then the data can be updated at a suitable timing by software means without providing a circuit in the nonvolatile memory for detecting the state of the memory cells. That is, volatilization of data of the nonvolatile memory can be easily and suitably suppressed.

The electronic device may execute the data updating processing based on any other variety of methods. For example, the time in which the nonvolatile memory is placed in a high-temperature environment of higher than a predetermined temperature is estimated, and the update processing may be executed every time when the estimated time exceeds a threshold value. Further, updating methods can be put into practice as demonstrated in the embodiments.

DETAILED DESCRIPTION OF THE PREFERRED EMBODIMENT

First Embodiment

Figure 1:
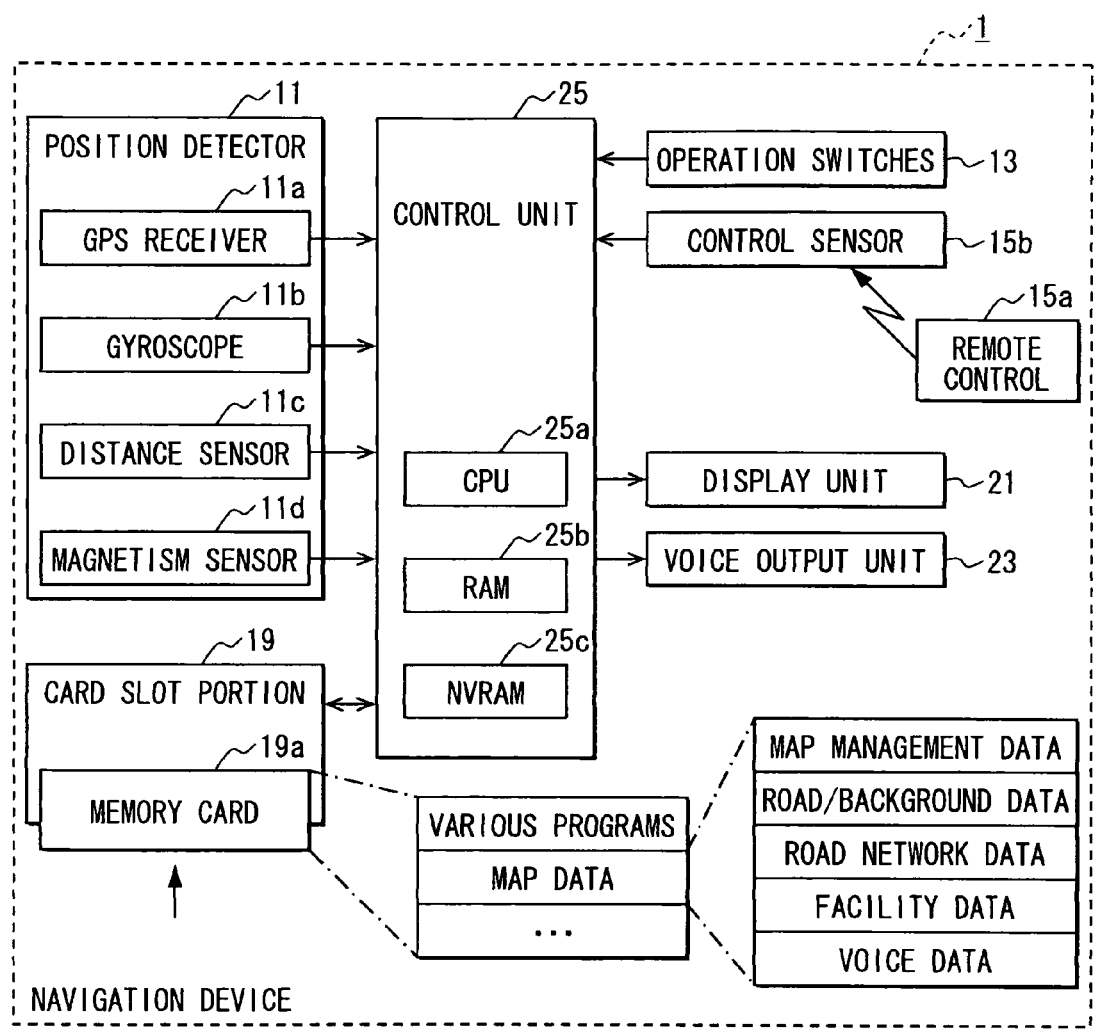
FIG. 1 is a block diagram illustrating a navigation device according to a first embodiment.

An electronic device of the invention is used as a part of a navigation device 1 that is mounted on a vehicle (automobile, etc.) as shown in FIG. 1.

The navigation device 1 includes a position detector 11, a group of operation switches 13, a remote control terminal 15a, a remote control terminal sensor 15b for detecting a signal transmitted from the remote control terminal 15a, a card slot portion 19 to which a memory card 19a storing map data is connected (fitted), a display portion 21 for displaying various images on a screen, a voice output portion 23 for outputting various kinds of voices, and a control unit 25 for generally controlling various portions in the device.

The position detector 11 includes a GPS receiver 11a which receives, through a GPS antenna, electromagnetic waves transmitted from artificial satellites for GPS (global positioning system) and detects the longitude and latitude of a present point, a gyroscope 11b for detecting the size of a rotational motion given to the subject vehicle mounting the navigation device 1, a distance sensor 11c for detecting a distance which the vehicle has traveled and a terrestrial magnetism sensor 11d for detecting the bearing in which the vehicle is traveling from the terrestrial magnetism, and inputs the signals detected by these portions 11a to 11d to the control unit 25.

On the other hand, the group of operation switches 13 is configured by a mechanical key switch provided around the display portion 21 and a touch panel configured integrally with the display portion 21, and works as a user interface which can be operated by a user.

Further, the display portion 21 is configured by a liquid crystal monitor and displays a map around the present position, a route to a destination specified by the user and the like on the screen of the display portion 21 being controlled by the control unit 25. Further, the voice output portion 23 includes a speaker and an amplifier, and outputs guide voices concerned to the route to the destination and the like being controlled by the control unit 25.

The card slot portion 19 is electrically connected to the memory card 19a, realizes the writing of data from the control unit 25 into the memory card 19a and reading of data from the memory card 19a by the control unit 25 and so configured that the memory card 19a can be detachably connected thereto. Specifically, the memory card 19a incorporates a NAND-type flash memory as an electrically data-rewritable nonvolatile memory. The card slot portion 19 realizes the writing of data from the control unit 25 into the flash memory and the reading of data from the flash memory by the control unit 25 according to an instruction from the control unit 25.

Further, the memory card 19a fitted to the navigation device 1 has recorded the data (inclusive of program) in advance necessary for the device to work as the navigation device 1. That is, if the memory card 19a purchased together with, or separately from, the navigation device 1 is connected to the card slot portion 19, the navigation device 1 realizes the function as the navigation device 1 based on the data stored in the memory card 19a.

Specifically, in the memory card 19a, various data are recorded before the shipment. The data include programs, which the control unit 25 executes, as well as map data inclusive of such data as those related to the road connections, facilities and topography. More specifically, the map data recorded in the memory card 19a include map management data illustrating the structure of map data as a whole and detailed data to where reference is made, road/background data representing the shapes of roads and background structure (topography), etc., road network data representing road connections, facility data representing the positions and names of the facilities, voice data used for guiding the routes and for illustrating the operation and the like.

Further, the control unit 25 includes a CPU 25a for executing various computing processing, a RAM 25b used as an operation region when the processing is executed by the CPU 25a, an NVRAM 25c for storing the data that are set, and a ROM (not shown) for storing a basic program such as boot program. The control unit 25 executes various processing by using the CPU 25a according to the programs stored in the ROM and the memory card 19a to thereby realize a function which is to be effected by the navigation device 1, such as route guide, etc.

Unlike the memory card 19a, the NVRAM 25c included in the control unit 25 is capable of fulfilling its function with a small storage capacity. Therefore, a memory having a high data storage capability is used as the NVRAM 25c. For example, a NOR-type flash memory can be used as the NVRAM 25c.

Further, the RAM 25b included in the control unit 25 is so configured as to hold the data upon being served with electric power at all times from a battery mounted on the vehicle irrespective of turn on/off of the navigation device 1, so that the data will not be volatilized when the navigation device 1 is turned off, though it is a temporary storage means.

That is, the RAM 25b in the navigation device 1 of this embodiment is capable of holding the data over a long period of time like the nonvolatile memory unless the supply of electric power from the battery is interrupted such as when the battery is removed from the vehicle or the battery is fully discharged.

At a moment when the memory card 19a is connected to the card slot portion 19, the control unit 25 reads, from the memory card 19a, the data management data (FAT, etc.) representing the data structure in the memory card 19a stored in the memory card 19a as well as the map management data, and stores them in a management data storage region in the RAM 25b. Thereafter, when the data are to be read out from the memory card 19a, a position on the memory card 19a where the data to be read out have been stored is specified according to the data management data and the map management data stored in the RAM 25b.

Further, at a moment when the memory card 19a is connected to the card slot portion 19, the control unit 25 reads the programs stored in the memory card 19a from the memory card 19a, and stores them in a program storage region in the RAM 25b. Thereafter, various processing are executed based on the programs stored in the RAM 25b.

Specifically, based on the above program, the control unit 25 reads, from the memory card 19a the map data around the position of the vehicle specified by a signal detected by the position detector 11, and executes map display processing to display, on the display portion 21, the map screen around the vehicle based on the map data that are read out. Hereinafter, the task for realizing the map display processing is called "map display processing task".

Further, based on the above program, the control unit 25 searches a route from the present position to a destination specified through the user interface by using the map data stored in the memory card 19a, and executes route guide processing for guiding the route to the destination obtained as a result of search to the user through the display portion 21 and the voice output portion 23. Hereinafter, the task for realizing the route guide processing is called "route guide processing task".

For example, the control unit 25 displays the route to the destination as a thick line overlapped on the map screen around the vehicle displayed on the display portion 21, and guides the direction in which the vehicle turns near an intersection where the vehicle is to turn through the voice output portion 23.

Based on the program, further, the control unit 25 accepts the operation for registering the point through the user interface, registers the data of the point specified by the user to the NVRAM 25c, displays an icon at a position on the map screen corresponding to the registered point (user's house, etc.), and executes registered point display processing for guiding the registered point to the user.

Figure 2A:
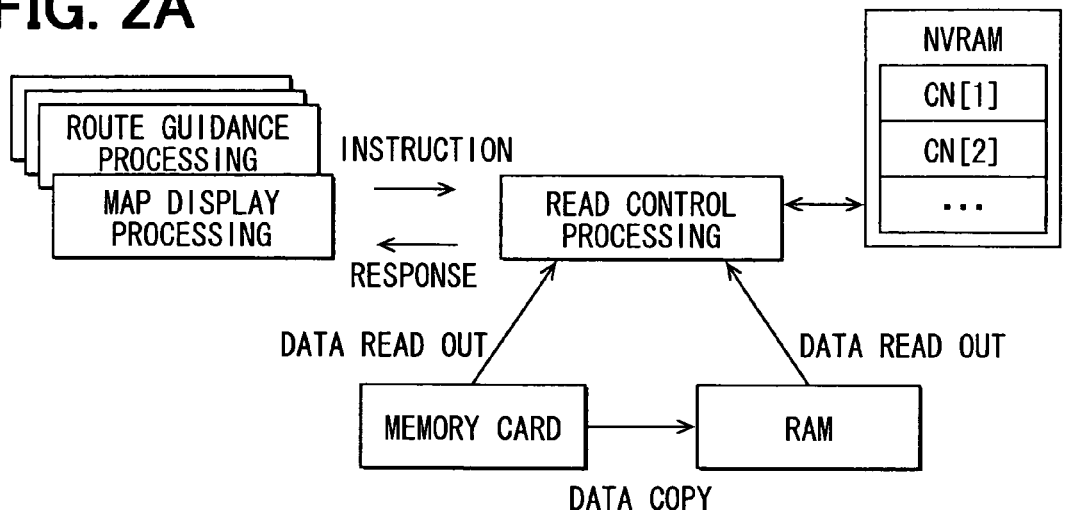
FIG. 2A is a diagram illustrating a state of obtaining data through read control processing.
Figure 2B:
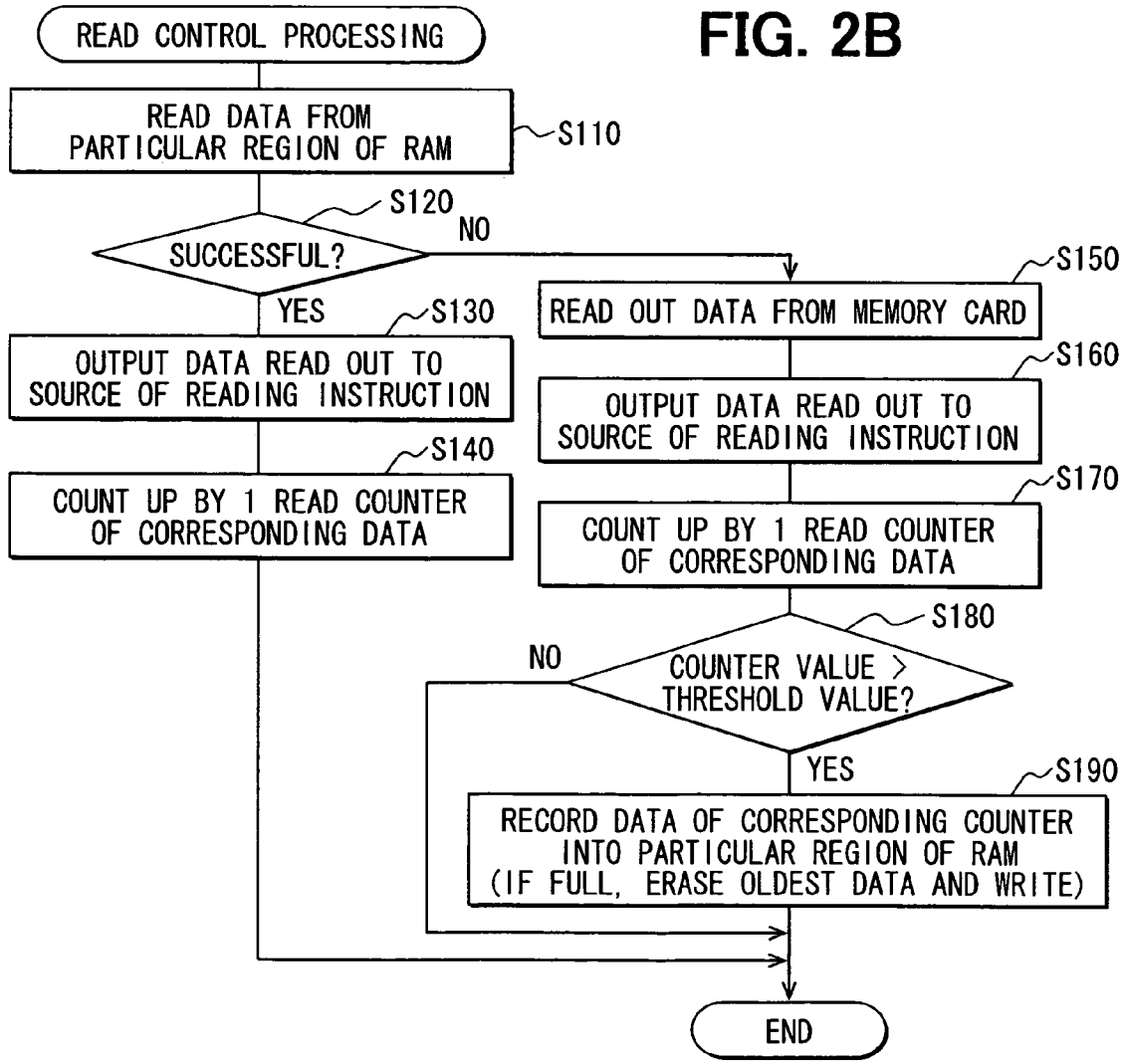
FIG. 2B is a flowchart illustrating the read control processing executed by a control unit.

In the navigation device 1, further, any of the programs executed by the control unit 25 is so configured as to basically call a program for realizing read control processing shown in FIG. 2B and to obtain the data other than the programs stored in the memory card 19a through the read control processing. For example, the programs for realizing the map display processing and the route guide processing are so configured as to obtain necessary map data through the read control processing shown in FIG. 2B.

Therefore, described below with reference to FIGS. 2A and 2B is the read control processing executed, first, by the control unit 25 at the time of obtaining the data.

If the read control processing starts responsive to a read instruction, the control unit 25, first, searches the data, which is specified to be read out by the read instruction, in a particular region in the RAM 25b. If the data to be read out are present in the particular region, then the data are read out from the particular region in the RAM 25b (S110). The particular region is a region for temporarily storing the data that are frequently read out among the data stored in the memory card 19a, and is provided having a fixed size independently from other operation regions (inclusive of management data storage region and program storage region) in the RAM 25b. In the particular region, the data which are frequently read out through processing at S190 that will be described later are written.

If reading the data to be read out (to-be-read data) from the particular region of the RAM 25b is successful (Yes at S120), the control unit 25 executes processing for outputting (handing over) the to-be-read data read out from the RAM 25b to the task from which the reading instruction was issued (S130). After the above processing, the read counter CN of a block corresponding to the data that are read out is counted up by 1 (CN←CN+1) at S140.

The block referred to here is a known block that constitutes the flash memory. Further, the read counter CN is a parameter representing the frequency of reading the data stored in a corresponding block. In this embodiment, the read counter CN is assigned to each block in the memory card 19a, and the read counter CN of each block is stored in the NVRAM 25c.

That is, the data can be read or written only in a unit of block for the memory card 19a. Therefore, one block is treated as a memory access unit by which the data can be read or written, and the frequency of reading the data from the flash memory is counted for each block.

After the data is read out, for the first time, from the NVRAM 25c by the RAM 25b, the read counter CN is counted up every time when the corresponding data are read out through the read control processing. The value after counted up is regularly written into the NVRAM 25c and is reflected on the read counter CN stored in the NVRAM 25c.

If the read counter CN is updated (counted up) at S140, the control unit 25 ends the read control processing.

On the other hand, if no data to be read out is stored in the particular region of the RAM 25b and if reading the data from the RAM 25b fails (No at S120), then the control unit 25 executes S150. Thereafter, access is made to the memory card 19a through the card slot portion 19, and the to-be-read data is read out from the memory card 19a. Thereafter, processing is executed to output the to-be-read data read out from the memory card 19a to the task from where the reading instruction was issued (S160).

After the processing at S160, the control unit 25 counts up by 1 and updates the read counter CN of the block corresponding to the data that are read out (S170). Namely, this increases by 1 the value of the read counter CN assigned to the block that corresponds to the data that are read out.

Thereafter, the control unit 25 checks if the read counter CN after updated (read counter CN of a block corresponding to the data that are read out) has exceeded a predetermined threshold value (S180). If it is determined that the read counter CN is not larger than the threshold value (No at S180), the read control processing ends without executing the processing of S190.

On the other hand, if it is determined that the read counter CN has exceeded the threshold value (Yes at S180), then the control unit 25 at S190 writes the data of a block corresponding to the read counter CN that has exceeded the threshold value (i.e., data read out from the memory card 19a at S150) into the particular region of the RAM 25b.

As described above, however, the particular region is maintained in advance as a region of a fixed size, and the data of an amount of a predetermined number of blocks only can be stored in the particular region. In writing the data at S190, therefore, if there is no vacant region in the particular region, the data written in the past are erased from the particular region, and the data read out this time are written into the particular region in the RAM 25b.

That is, every time when the data of a block having a reading frequency of equal to or larger than the threshold value are read out from the memory card 19a, the control unit 25 erases the data written in the particular region starting from the older ones, and registers the data of a newly read block into the particular region in order to store and hold in the RAM 25b the data of an amount of a predetermined number of blocks out of the data of the blocks recently read out.

After the processing at S190, further, the control unit 25 ends the read control processing. Thus, the control unit 25 holds the data of blocks that are highly frequently read out in the RAM 25b, suppresses the frequency of reading out the data from the memory card 19a and prevents the volatilization of data in the memory card 19a caused by an increase in the reading frequency.

In order to prevent map data and the like written in the memory card 19a from volatilizing with the passage of time, further, the navigation device 1 estimates the passage of time from the date and hour the data were written into the memory card 19a and refreshes the memory card 19a as a whole at a moment when the passage of time exceeds the threshold value.

Figure 3:
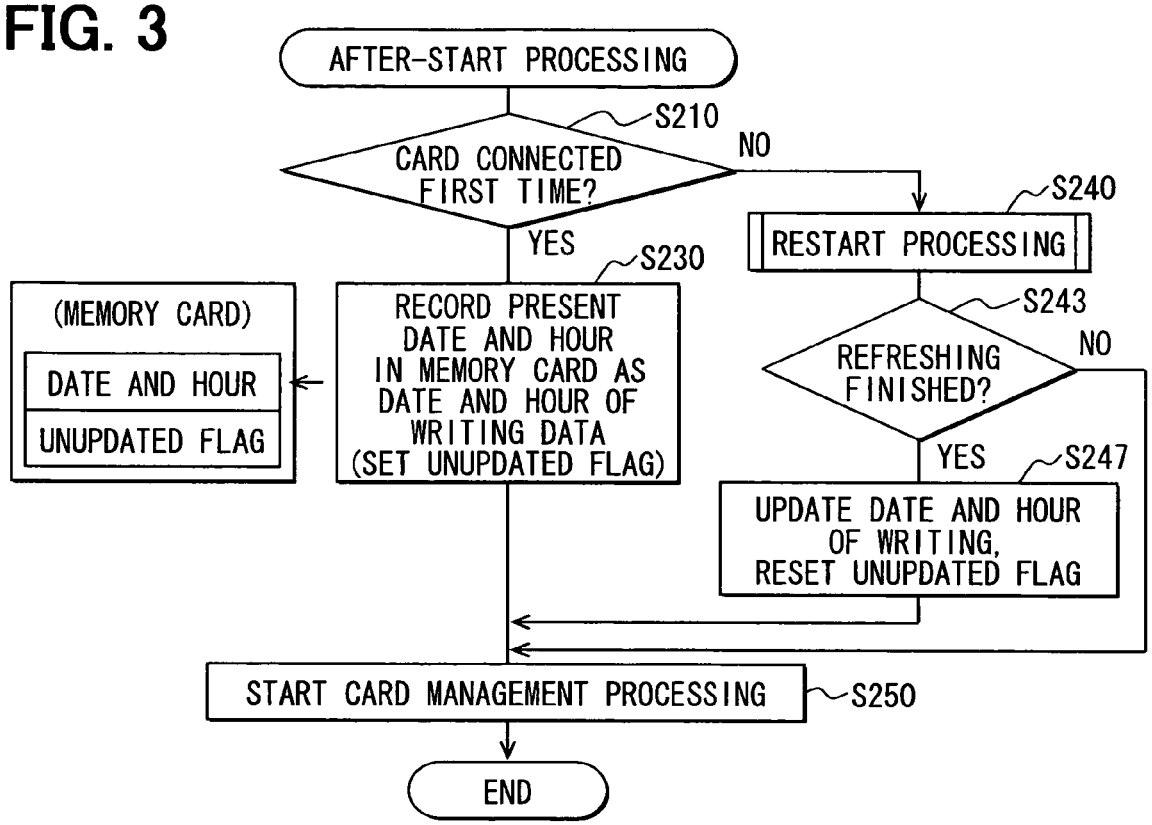
FIG. 3 is a flowchart illustrating an after-start processing executed by the control unit.

Next, described below with reference to FIGS. 3 to 7 is processing executed by the control unit 25 for realizing the refreshing operation. FIG. 3 is a flowchart illustrating after-start processing executed by the control unit 25 when an accessory (ACC) switch is turned on and immediately after the navigation device 1 is turned on. Here, however, if the memory card 19a is not connected to the card slot portion 19 at a moment when the navigation device 1 is turned on, the control unit 25 starts the after-start processing at a moment when the memory card 19a is connected to the card slot portion 19.

Upon the start of the after-start processing illustrated in FIG. 3, the control unit 25, first, checks if the memory card 19a connected to the card slot portion 19 is the one that is connected to the card slot portion 19 for the first time (S210). In this embodiment, the data related to the date and hour of writing data are recorded at S230 in a predetermined region of the memory card 19a that is connected for the first time. At S210, therefore, it is checked if the data related to the date and hour of writing data have been recorded in the predetermined region of the memory card 19a and, therefore, checked if the memory card 19a that is connected is the one that is connected to the card slot portion 19 for the first time.

If it is determined that the memory card 19a is the one that is connected for the first time (Yes at S210), the control unit 25 records the present date and hour as the data related to the date and hour of writing data into the predetermined region of the memory card 19a as described above (S230). At the same time, a value 1 is recorded as data of unupdated flag in a predetermined region of the memory card 19a to set the unupdated flag. The unupdated flag is set during a period of from when the memory card 19a is connected for the first time until when the memory card 19a is refreshed for the first time, and is, thereafter, reset (value 0).

Figure 4:
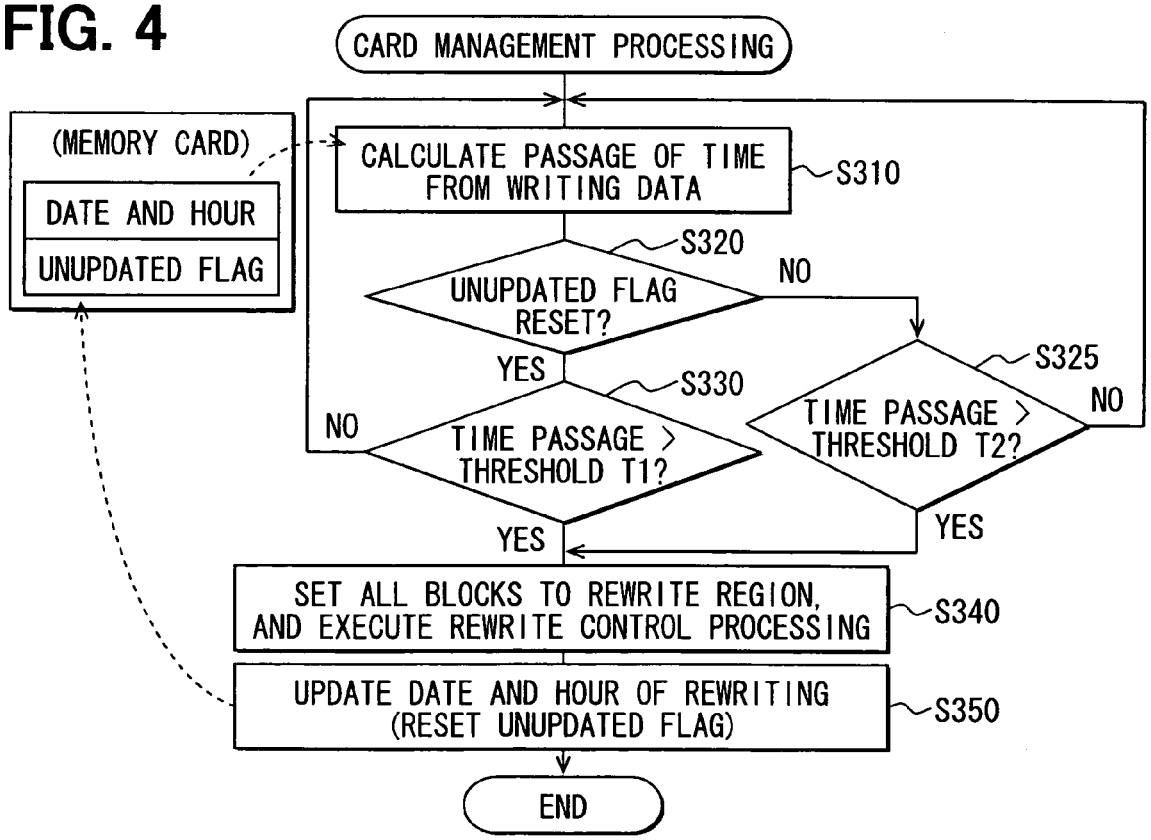
FIG. 4 is a flowchart illustrating card management processing executed by the control unit.

After the processing at S230 as described above, the control unit 25 starts executing card management processing shown in FIG. 4 (S250) and, thereafter, ends the after-start processing. In card writing processing as will be described later in detail, when the unupdated flag is in the reset state, the operation for refreshing the memory card 19a is executed at a moment when a threshold value T1 (e.g., one year) is exceeded by the passage of time from the date and hour the data were recorded in the memory card 19a. When the unupdated flag is in the set state, on the other hand, the operation for refreshing the memory card 19a is executed at a moment when a threshold value T2 (e.g., one month) shorter than the above threshold value T1 is exceeded by the passage of time from the date and hour the data were recorded in the memory card 19a. The unupdated flag is used for changing over the above processing.

Figure 7:
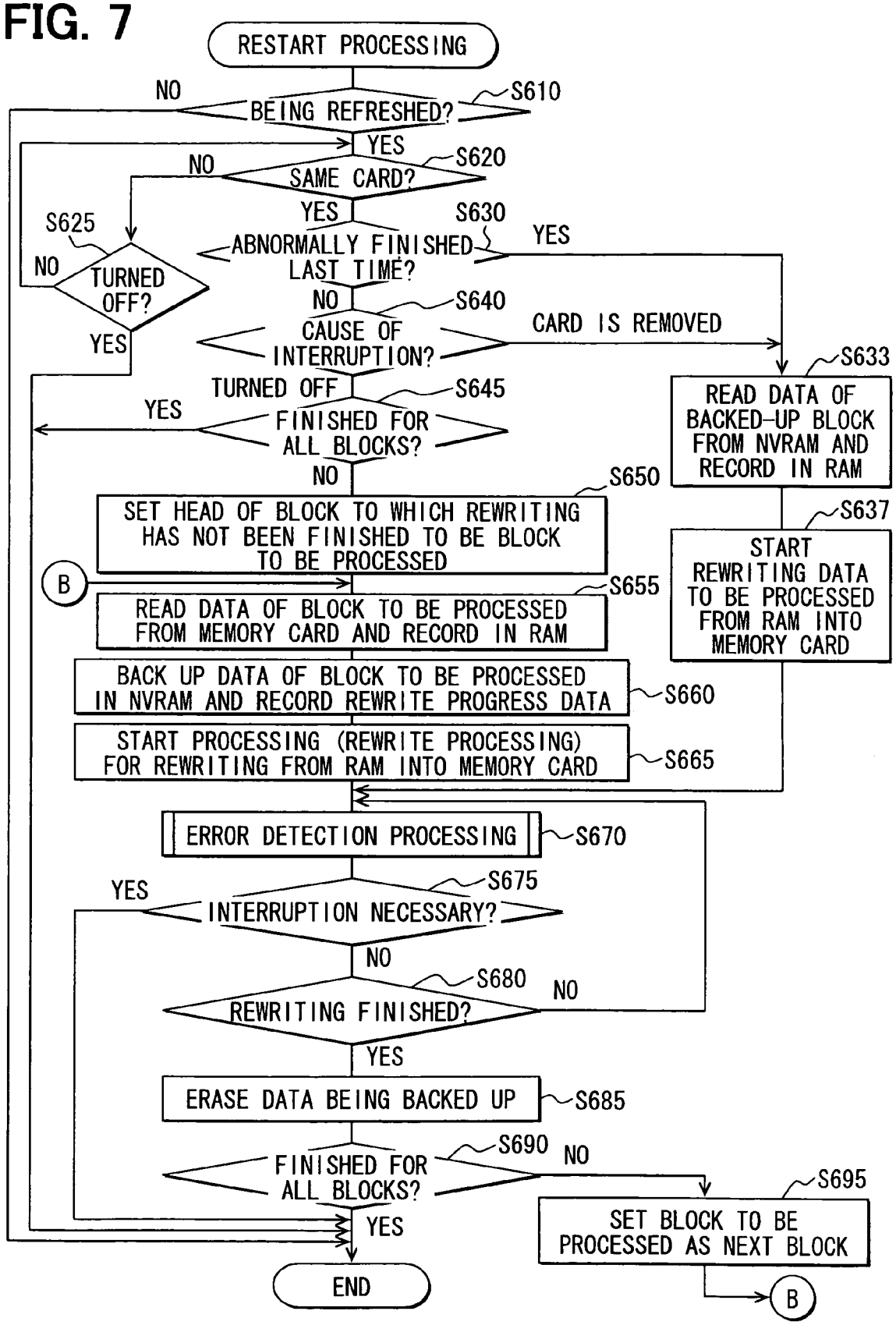
FIG. 7 is a flowchart illustrating restart processing executed by the control unit.

Further, if it is determined that the card 19a connected to the card slot portion 19 is not the card 19a that is connected for the first time (No at S210), the control unit 25 executes restart processing illustrated in FIG. 7 at S240.

If the operation for refreshing the memory card 19a is interrupted by some cause, the restart processing executes the operation for starting the refreshing operation again. If the refreshing operation is not interrupted, the control unit 25 ends the restart processing without executing any processing.

After the end of the restart processing at S240 as described above, the control unit 25 checks if the operation for refreshing the memory card 19a has been finished by the just preceding restart processing (specifically, if the restart processing has finished upon rendering the affirmative determination at S690 or S645) (S243). If it is determined that the refreshing operation has been finished (Yes at S243), the control unit 25 updates the date and hour of writing data and stored in the predetermined region of the memory card 19a to the present date and hour (S247). Thereafter, at S250, the card management processing illustrated in FIG. 4 starts to be executed, and the after-start processing ends.

In the restart processing, on the other hand, if the operation for refreshing the memory card 19a has not been completed (i.e., if No at S610 or Yes at S625 or S675, and the restart processing has been finished) (No at S243), S250 is executed without executing the processing of S247. Thereafter, the card management processing illustrated in FIG. 4 starts to be executed (S250), and the after-start processing ends. Here, however, if determined to be Yes at S625 or S675, then the processing of S250 is not executed, the after-start processing ends and the navigation device 1 turns off.

Next, described below is the card management processing (FIG. 4) which the control unit 25 starts executing at S250.

Upon the start of the card management processing, the control unit 25 calculates the passage of time from the date and hour of writing data based upon the data related to the date and hour of writing data and recorded in the predetermined region of the memory card 19a connected to the card slot portion 19 (S310). Further, the unupdated flag stored in the memory card 19a is referred to in order to check if the unupdated flag is in the reset state (S320). If the unupdated flag is determined to be in the reset state (Yes at S320), S330 is executed.

At S330, further, it is checked if the passage of time calculated at S310 is in excess of the predetermined threshold value T1 (e.g., one year). If it is determined that the passage of time is not in excess of the threshold value T1 (No at S330), S310 is executed. As described above, if the unupdated flag is in the reset state, the control unit 25 stands by until the passage of time exceeds the threshold value T1.

Figure 5:
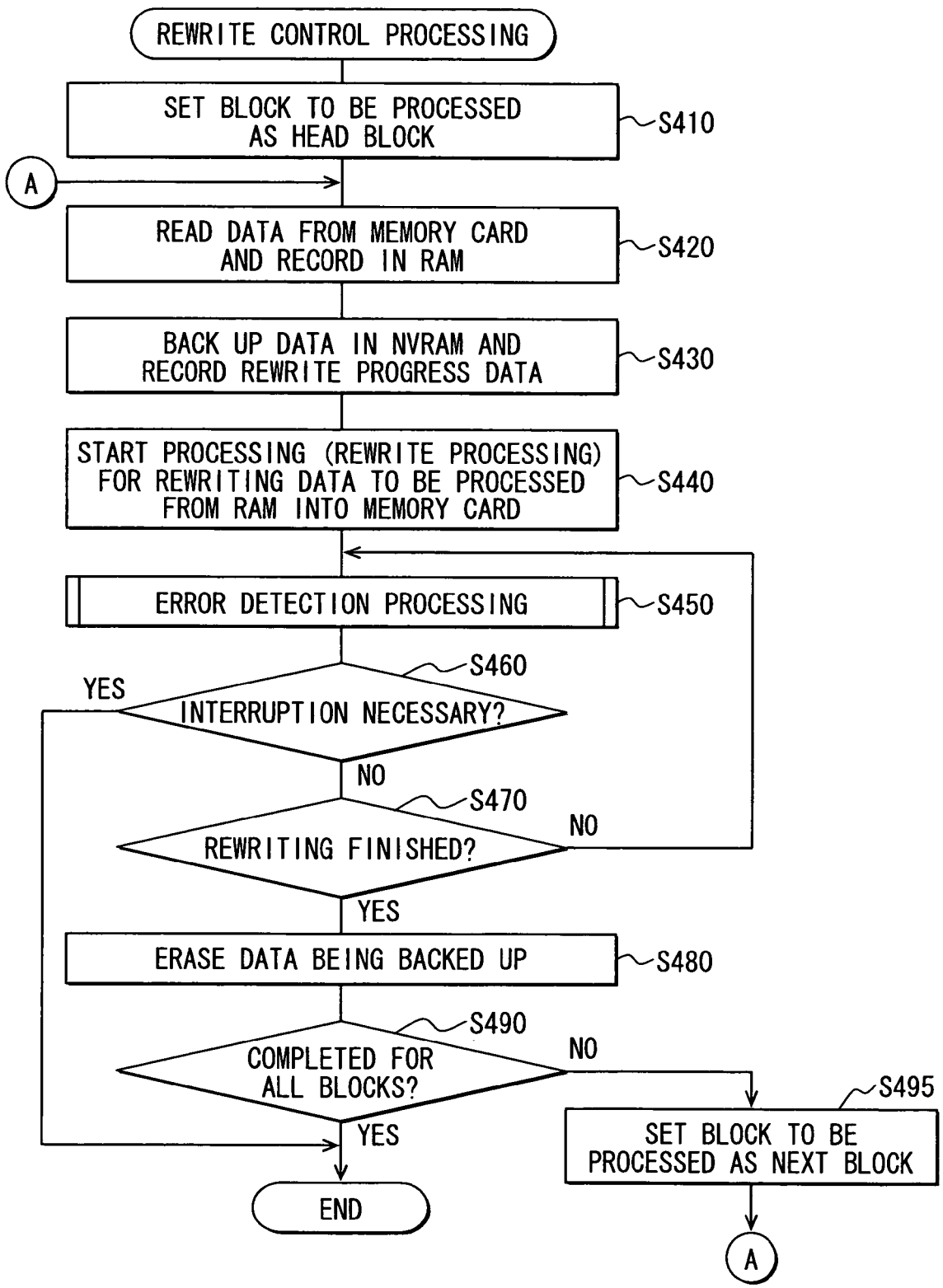
FIG. 5 is a flowchart illustrating rewrite control processing executed by the control unit.

If it is determined that the passage of time is in excess of the threshold value T1 (Yes at S330), all of the blocks of the memory card 19a are set at S340 to a rewrite region that is to be refreshed, and rewrite control processing illustrated in FIG. 5 is executed. Thus, the whole data in the memory card 19a are refreshed (details will be described later). After the end of the rewrite control processing upon having finished the processing for rewriting all of the blocks, the date and hour of writing data and stored in the memory card 19a are updated to the present date and hour (S350), and the card management processing ends.

On the other hand, if it is determined that the unupdated flag is in the set state (No at S320), the control unit 25 determines at S325 if the passage of time calculated at S310 is in excess of the threshold value T2 (e.g., one month). If it is determined that the passage of time is not in excess of the threshold value T2 (No at S325), S310 is executed. Thus, if the unupdated flag is in the set state, the control unit 25 stands by until the passage of time exceeds the threshold value T2.

If it is determined that the passage of time is in excess of the threshold value T2 (Yes at S325), all of the blocks of the memory card 19a are set to the rewrite region at S340 as described above, and the rewrite control processing is executed. Thus, the whole data in the memory card 19a are refreshed. After the end of the processing of S340 upon having finished the processing for rewriting all of the blocks, the date and hour of writing data and stored in the memory card 19a are updated to the present date and hour, and the unupdated flag in the set state stored in the memory card 19a is updated to be in the reset state (S350). Thereafter, the card management processing ends.

Next, described below is the rewrite control processing (FIG. 5) executed by the control unit 25 at S340. The operation of refreshing described above is executed by the rewrite control processing.

Upon the start of the rewrite control processing, the control unit 25 sets a head block in the rewrite region as a block to be processed based on the data in the rewrite region that are set at the time of executing the rewrite control processing (S410). Thereafter, subsequent processing (S420 and onward) are executed.

That is, if the block to be processed is set at S410, the control unit 25 reads out the data stored in the to-be-processed block from the memory card 19a at S420, and temporarily stores the data that are read out in the RAM 25b. Here, the data are read out without through the above read control processing. At S420, further, the above data that are read out are written into an operation region independent from the particular region of the RAM 25b, and are temporarily stored in the RAM 25b.

After the end of the processing, further, the control unit 25 saves the data in the to-be-processed block in the NVRAM 25c for backing up in order to prevent the data in the to-be-processed block from extinguishing due to troubles, etc. At the same time, to cope with the troubles, rewrite progress data representing the degree of performing the rewrite control processing is recorded in the NVRAM 25c (S430). For example, recording is made of the data in the rewrite region set at the time of executing the rewrite control processing and the data of a block for which the rewrite processing is completed.

After the processing at S430, the control unit 25 starts the processing (rewrite processing) for rewriting the data of the to-be-processed block, which was read out to the RAM 25b, from the RAM 25b into the memory card 19a (S440), and refreshes the data of the to-be-processed block stored in the memory card 19a. Due to this operation, the data in the to-be-processed block stored in the memory card 19a are updated, and the potential of the memory cells that had been lowered with the passage of time is restored to the normal potential.

Figure 6:
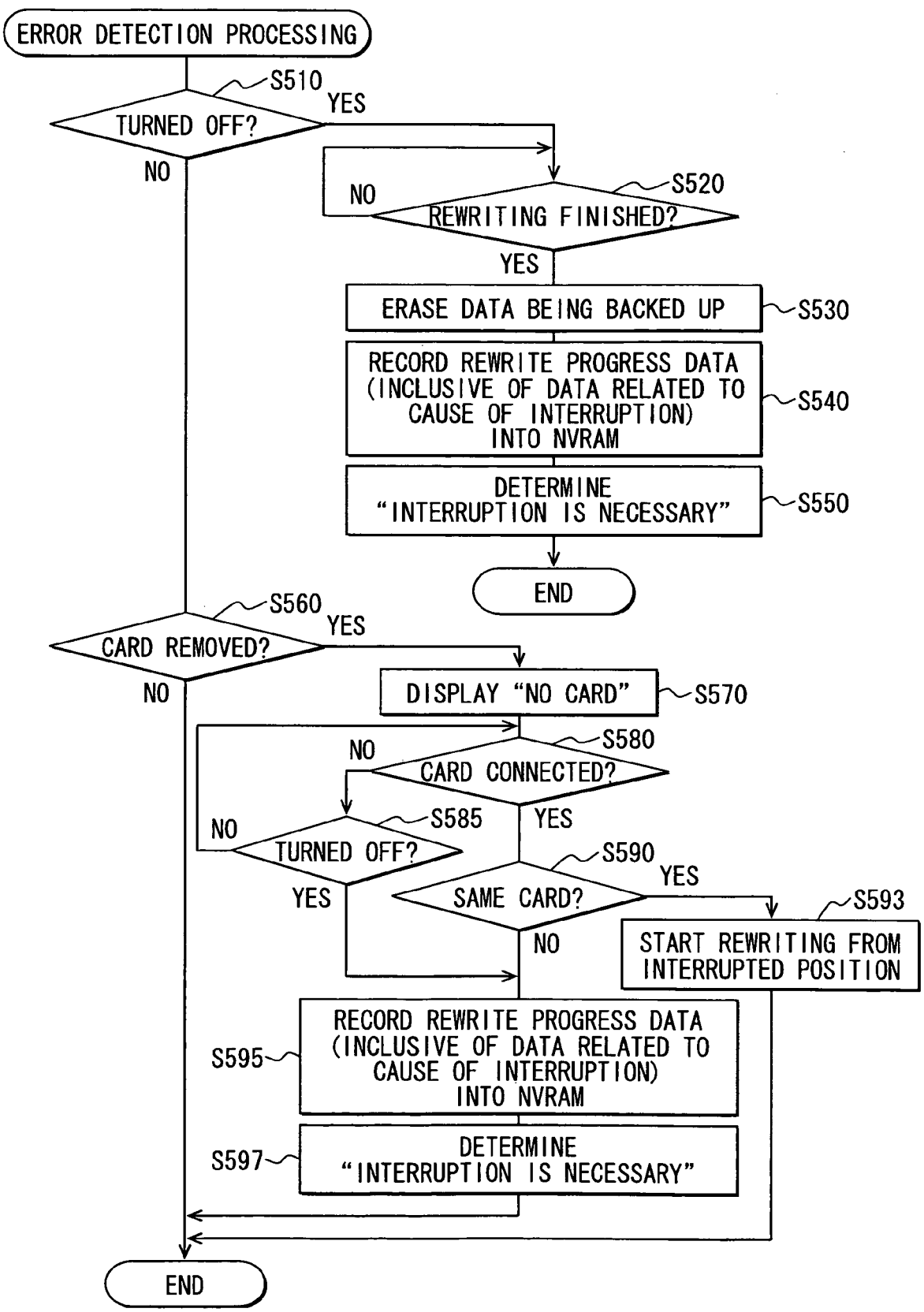
FIG. 6 is a flowchart illustrating error detection processing executed by the control unit.

After the start of the rewrite processing, the control unit 25 also executes error detection processing in parallel therewith during a period until the rewrite processing finishes (S450). FIG. 6 is a flowchart illustrating the error detection processing executed by the control unit 25.

Upon the start of the error detection processing, the ACC switch of the vehicle is turned off and, therefore, the control unit 25 checks if the navigation device 1 is turned off (S510). If it is determined that the navigation device 1 is turned off (Yes at S510), S520 is executed and if it is determined that the navigation device 1 is not turned off (No at S510), S560 is executed.

Upon executing S520, the control unit 25 stands by until the rewrite processing is all finished for the to-be-processed blocks that are now under the rewrite processing. After the rewrite processing is all finished (Yes at S520), the control unit 25 erases the data in the to-be-processed block backed up in the NVRAM 25c (S530). At the same time, the control unit 25 updates the rewrite progress data stored in the NVRAM 25c(S540). Specifically, at S540, the data of a block for which the rewrite processing represented by the rewrite progress data has finished, are updated to the present state, and the data representing the interruption due to the turn-off operation are added as data representing the cause of interruption to the rewrite progress data.

Further, after the end of the processing at S540, the control unit 25 so determines that "interruption is necessary" (S550), and the error detection processing ends.

Upon executing S560, on the other hand, the control unit 25 checks if the memory card 19a is removed from the card slot portion 19. If the memory card 19a has not been removed from the card slot portion 19 (No at S560), the error detection processing ends without executing the processing of S570 to S597.

On the other hand, if it is determined that the memory card 19a has been removed from the card slot portion 19 (Yes at S560), the control unit 25 at S570 displays on the display portion 21 a message stating that the memory card 19a has not been connected, and recommends the user to connect the memory card 19a to the card slot portion 19.

Thereafter, the control unit 25 checks if the memory card 19a is connected to the card slot portion 19 (S580). If the memory card 19a has not been connected to the card slot portion 19 (No at S580), the control unit 25 checks if the navigation device 1 is turned off (S585). If the navigation device 1 has not been turned off (No at S585), the control unit 25 executes S580. Thus, the control unit 25 stands by until the memory card 19a is connected to the card slot portion 19 or until the navigation device 1 is turned off.

If the navigation device 1 is turned off (Yes at S585), the rewrite progress data in the NVRAM 25c is updated (S595), determination is rendered that "interruption is necessary" (S597), and the error detection processing ends. Specifically at S595, the data of a block for which the rewrite processing represented by the rewrite progress data has finished are updated to meet the present situation, and data representing interruption due to the removal of the memory card are added to the rewrite progress data as data representing the cause of interruption. Thereafter, determination is rendered that "interruption is necessary" (S597), and the error detection processing ends.

Moreover, when the memory card 19a is connected to the card slot portion 19 (Yes at S580), the control unit 25 checks if the memory card 19a connected to the card slot portion 19 is the same card as the one used last time (S590).

More specifically, it is determined at S590 if the memory card 19a connected to the card slot portion 19 is the same card as the memory card 19a connected to the card slot portion 19 in the previous time, i.e., in the last time based upon the individual number that has been recorded in advance in the memory card 19a.

If it is determined that the memory card 19a connected this time is the same card as the one used last time (Yes at S590), the rewrite processing starts from a position where the processing was interrupted due to the removal of the memory card 19a (S593) and, thereafter, the error detection processing ends.

On the other hand, if it is determined that the memory card 19a connected this time is not the same card as the one used last time (No at S590), the control unit 25 updates the rewrite progress data in the NVRAM 25c at S595, thereafter, determines that "interruption is necessary" (S597), and ends the error detection processing.

Further, if the execution of error detection processing ends at S450, the control unit 25 determines at S460 if determination is rendered that "interruption is necessary" in the error detection processing (S460). If it is determined that the determination is rendered that "interruption is necessary" (Yes at S460), the rewrite control processing (in other words, refresh operation) is interrupted without executing processing after S470. Here, if the rewrite control processing is interrupted at S340 due to the determination "interruption is necessary", the control unit 25 turns the navigation device 1 off without executing the processing of S350.

On the other hand, if it is determined in the error detection processing that determination has not been rendered that "interruption is necessary" (No at S460), the control unit 25 determines at S470 if the rewrite processing is completed for the to-be-processed blocks. That is, it is checked if the data of the to-be-processed blocks are all written into the memory card 19a. If it is determined that the rewrite processing has not been completed for the to-be-processed blocks (No at S470), S450 is executed.

If the rewrite processing has been completed for the to-be-processed blocks (Yes at S470), the control unit 25 erases, from the NVRAM 25c, the data of the to-be-processed blocks saved for backing up in the NVRAM 25c (S480). Thereafter, the rewrite processing ends for all blocks in the rewrite region, and it is checked if the data in the corresponding blocks are all refreshed (S490).

If it is determined at S490 that the rewrite processing has not been finished for all blocks in the rewrite region (No at S490), the control unit 25 changes the to-be-processed block to the next block (S495), and executes the processing after S420 for the to-be-processed blocks.

Thus, the control unit 25 executes the rewrite processing for each block and, after the rewrite processing has finished for all blocks in the rewrite region (Yes at S490), ends the rewrite control processing.

Next, described with reference to FIG. 7 is the restart processing executed by the control unit 25 at S240 (FIG. 3).

Upon the start of the restart processing, the control unit 25 checks if the rewrite progress data has been recorded in the NVRAM 25c and checks if the refresh operation (rewrite control processing) started by the navigation device 1 is interrupted (S610). Here, the rewrite progress data are erased from the NVRAM 25c at a moment when the date and hour of writing data into the memory card 19a are updated (S247, S350).

If the rewrite progress data have been recorded in the NVRAM 25c, the control unit 25 determines that the refresh operation (rewrite control processing) is interrupted (Yes at S610) and executes S620. On the other hand, if the rewrite progress data have not been recorded in the NVRAM 25c, the negative determination is rendered (No at S610), and the restart processing ends without executing the processing of S620 to S695.

Upon executing S620, the control unit 25 checks if the same card is connected to the card slot portion 19 as the memory card 19a that had been connected to the card slot portion 19 just before the refresh operation was interrupted. If it is determined that the same card has not been connected to the card slot portion 19 (No at S620), then it is checked if the navigation device 1 has been turned off (S625).

If it is determined that the navigation device 1 has not been turned off (No at S625), S620 is executed. Thus, the control unit 25 stands by until the memory card 19a is connected to the card slot portion 19, which memory card is the same as the memory card 19a that had been connected just before the interruption or until the navigation device 1 is turned off. If the navigation device 1 is turned off (Yes at S625), the restart processing ends.

On the other hand, if the memory card 19a which is the same as the memory card 19a that had been connected just before the interruption is connected to the card slot portion 19 (Yes at S620), the control unit 25 checks at S630 if the refresh operation has abnormally ended. Here, if the data representing the cause of interruption has not been recorded in the NVRAM 25c, the affirmative determination is rendered to the effect that the refresh operation has abnormally ended (Yes at S630). If the data representing the cause of interruption has been recorded in the NVRAM 25c, the negative determination is rendered (No at S630).

If the refresh operation is determined to have abnormally ended (Yes at S630), the control unit 25 reads the data of the to-be-processed block saved for backing up in the NVRAM 25c, stores them in the RAM 25b (S633), and starts the processing (rewrite processing) for rewriting the data in the to-be-processed block into the memory card 19a from the RAM 25b based on the rewrite progress data recorded in the NVRAM 25c (S637). Thereafter, S670 is executed.

On the other hand, if the refresh operation is determined not to have abnormally ended (No at S630), the control unit 25 determines at S640 if the cause of interruption is due to the turn-off operation or due to the removal of the memory card based on the data representing the cause of interruption recorded in the NVRAM 25c.

If it is determined that the cause of interruption is due to the removal of the memory card, the control unit 25 at S633 reads the data of the to-be-processed block saved for backing up in the NVRAM 25c and stores them in the RAM 25b as described above, and starts the processing for rewriting the data of the to-be-processed block into the memory card 19a from the RAM 25b (S637). Thereafter, S670 is executed.

Furthermore, if it is determined that the cause of interruption is due to the turn-off operation, the control unit 25 at S645 checks if the rewrite processing is finished for all of the blocks in the rewrite region that has now been set based on the rewrite progress data stored in the NVRAM 25c (S645). If it is determined that the rewrite processing has been finished for all of the blocks in the rewrite region (Yes at S645), the restart processing ends.

On the other hand, if it is determined that the rewrite processing has not been finished for all of the blocks in the rewrite region (No at S645), the head block in a group of blocks for which the rewrite processing has not been completed is set at S650 to be the to-be-processed block.

Thereafter, the control unit 25 reads the data of the to-be-processed block set at S650 from the memory card 19a, and writes them into the RAM 25b (S655). At the same time, the data of the to-be-processed block that are read out are saved for backing up in the NVRAM 25c. Further, the rewrite progress data stored in the NVRAM 25c are updated (S660). Here, specifically, the rewrite progress data are updated by effecting the processing for erasing, from the NVRAM 25c, the data representing the cause of interruption among the rewrite progress data.

After the processing at S660, the control unit 25 starts the processing for rewriting the data of the to-be-processed block into the memory card 19a from the RAM 25b (S665). Thereafter, S670 is executed.

At S670, further, the error detection processing illustrated in FIG. 6 is executed (S670). After the end of the error detection processing, it is checked if determination is rendered that "interruption is necessary" in the error detection processing (S675). If it is determined that the determination was rendered that "interruption is necessary" (Yes at S675), the restart processing (in other words, refresh operation) is interrupted without executing processing after S680.

On the other hand, if it is determined that the determination was not rendered that "interruption is necessary" in the error detection processing (No at S675), the control unit 25 checks at S680 if the rewrite processing is completed for the to-be-processed block like in the processing at S470. If it is determined that the rewrite processing has not been completed for the to-be-processed block (No at S680), S670 is executed.

If the rewrite processing is completed for the to-be-processed block (Yes at S680), the control unit 25 erases, from the NVRAM 25c, the data of the to-be-processed block saved for backing up in the NVRAM 25c (S685). Thereafter, it is checked if the rewriting processing is finished for all of the blocks in the rewrite region (S690).

If it is determined that the rewrite processing has not been finished at S690 (No at S690), the to-be-processed block is changed to the next block (S695), and the processing after S655 are executed for the to-be-processed block.

As described above, the control unit 25 executes the rewrite processing for each block. After the rewrite processing is finished for all of the blocks in the rewrite region (Yes at S690), the restart processing ends.

According to the navigation device 1 of the above first embodiment, the passage of time from a moment the data are written into the memory card 19a is estimated based on the data related to the date and hour of writing data and recorded in the memory card 19a (S310), and the rewrite control processing is executed every time when the passage of time from the date and hour of writing data exceeds the threshold value T1 (threshold value T2 in the first time only) (S340) to refresh the whole date in the memory card 19a.

Therefore, the navigation device 1 makes it possible to prevent the data in the memory card 19a from being volatilized with the passage of time and to prevent the occurrence of erroneous operation thereof caused by the volatilization of data. The above operation is realized by executing the program by the control unit 25. Therefore, the interior of the memory card 19a can be refreshed easily and at a suitable timing without the need of providing a circuit for detecting the state of the memory cells, and the volatilization of data can be easily and suitably suppressed.

Moreover, the passage of time from the moment the map data, etc. are written into the memory card 19a is estimated based on the data of date and hour of writing data and recorded in the memory card 19a. Therefore, if the data related to the date and hour of writing data are recorded in the memory card 19a at the time of writing the data before shipping the memory card 19a, the passage of time from when the data were written for the first time in the factory can be correctly comprehended by the navigation device 1. Therefore, the refreshing operation of the first time can be executed at a suitable timing irrespective of the term after the shipment of the memory card 19a until the memory card 19a is purchased by a consumer.

When connected to the navigation device 1 for the first time, further, the date and hour of connection is recorded as data related to the date and hour of writing data into the memory card 19a to which the data of date and hour of writing data have not been recorded (S230). Based on the data of date and hour of writing data and recorded in the memory card 19a, the navigation device 1 estimates the passage of time from the moment the memory card 19a was connected for the first time to the card slot portion 19 as the passage of time from the moment the data are written into the memory card 19a, and executes the refreshing operation at a moment when the passage of time has exceeded the threshold value.

Therefore, even in case the data of date and hour of writing data have not been recorded in the memory card 19a in the factory, the data in the memory card 19a can be updated at a suitable timing to prevent the volatilization of data.

In particular, by taking into consideration an error of when the passage of time from the moment the memory card 19a is connected for the first time to the card slot portion 19 is estimated as the passage of time from the moment the data are written into the memory card 19a, the threshold value T2 is set to be shorter than the threshold value T1, and the refresh operation of the first time is executed at a slightly earlier timing.

Therefore, even when the date and hour of writing data before the shipment cannot be correctly grasped, the refresh operation can be executed at a suitable timing.

Moreover, for the data which are highly frequently read out, copy data thereof are temporarily stored in the particular region of the RAM 25b so that the data do not have to be read out from the memory card 19a each time (S190). According to the navigation device 1, the data which are highly frequently read out do not have to be read out from the memory card 19a each time, which can prevent such a probability that the retention decreases due to an increased frequency of reading from the memory card 19a and that the data which are highly frequently read out from the memory card 19a are volatilized prior to executing the processing at S340. Therefore, an excellent navigation device is provided suppressing the occurrence of error due to the volatilization of data.

In this embodiment, the function of data updating means is realized by the rewrite control processing at S340, by the processing at S350 and the like, which are executed by the control unit 25, and the function of means for estimating the passage of time after the writing is realized by the processing at S230 and S310. Moreover, the function of update control means is realized by the processing of S320 to S330, and the function of read control means is realized by the processing of S110 to S130 and S150 to S160. Further, the function of means for counting the total frequency of reading is realized by the processing of S140 and S170, and the function of copy data-forming means is realized by the processing of S180 to S190.

Second Embodiment

The navigation device 1 of a second embodiment is the same as the navigation device 1 of the first embodiment. Therefore, described below is only the content of processing which the control unit 25 realizes in a software manner.

Figure 8A:
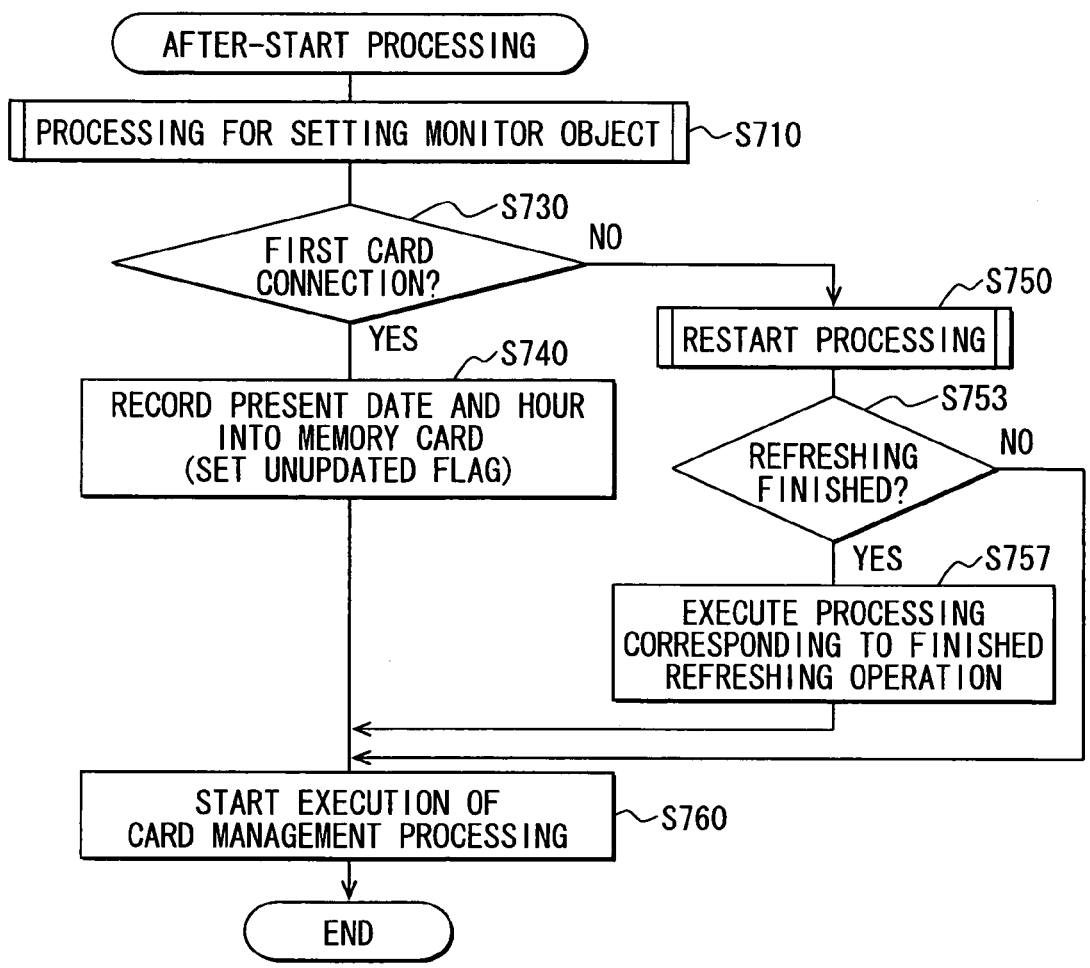
FIG. 8A is a flowchart illustrating the after-start processing according to a second embodiment.

The control unit 25 executes the after-start processing illustrated in FIG. 8A instead of the after-start processing illustrated in FIG. 3.

Immediately after the ACC switch is turned on and the navigation device 1 is turned on, the control unit 25 starts executing the after-start processing illustrated in FIG. 8A. Here, however, if the memory card 19a has not been connected to the card slot portion 19 at a moment when the navigation device 1 is turned on, the control unit 25 starts the after-start processing at a moment when the memory card 19a is connected to the card slot portion 19.

Figure 8B:
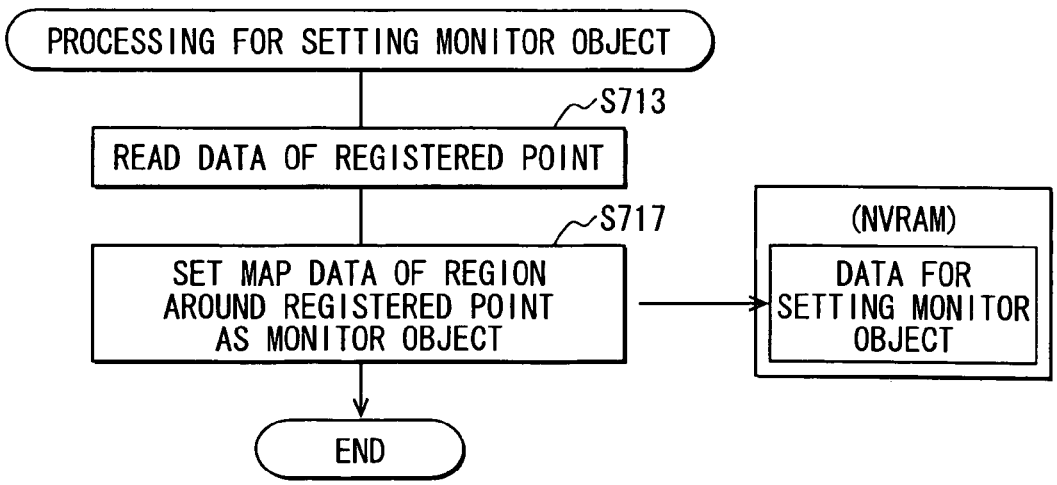
FIG. 8B is a flowchart illustrating a monitor object setting processing executed by the control unit.

Upon the start of the after-start processing, the control unit 25 executes processing for setting a monitor object, which is to be monitored, illustrated in FIG. 8B (S710).

Upon the start of the processing for setting the monitor object at S710, the control unit 25, first, reads the data of a registered point stored in the NVRAM 25c (S713). Like in the first embodiment, the navigation device 1 accepts the operation for registering the point through the user interface, registers the data of the point specified by the user as data of the registered point to the NVRAM 25c, and displays an icon at a position on the map screen corresponding to the registered point (user's home, etc.) based on the data of the registered point to guide the registered point for the user.

At S713, the data of the registered point representing the point registered through the above operation for registering the point are read out from the NVRAM 25c. Based on the data of the registered point that are read out, the map data around the registered point which is a base point are set as a monitor object for each of the registered points represented by the data of the registered points, and the thus set content is recorded in the NVRAM 25c (S717). For example, the map data of the same administrative section as the registered point (city, town, village, etc.) are set as a monitor object. The thus set content is recorded in the NVRAM 25c. Thereafter, the processing for setting a monitor object ends.

After the end of the processing for setting the monitor object of the content at S710, the control unit 25 determines at S730 if the memory card 19a connected to the card slot portion 19 is the one that was connected for the first time to the card slot portion 19 like in the processing at S210 (S730).

If it is determined that the memory card 19a is connected for the first time (Yes at S730), the present date and hour are recorded as the data of the date and hour of writing data into a predetermined region of the memory card 19a (S740) like in the first embodiment. At the same time, a value 1 is recorded as data of an unupdated flag into a predetermined region of the memory card 19a to thereby set the unupdated flag.

After the end of the processing at S740, further, the control unit 25 starts executing the card management processing illustrated in FIG. 4 (S760) and, thereafter, ends the after-start processing.

Thus, while the navigation device 1 is being turned on, the control unit 25, according to the card management processing, checks if a predetermined period of time (threshold values T1, T2) has passed from the date and hour of writing data. If the predetermined period of time has passed, the control unit 25 sets all of the blocks in the memory card 19a to the rewrite region to refresh the whole data in the memory card 19a.

If the refresh operation is interrupted due to the turn-off operation or the like, the restart processing illustrated in FIG. 7 is executed (S750) when the navigation device is turned on to resume the refreshing operation and to complete the refreshing operation.

That is, if it is determined that the memory card 19a connected to the card slot portion 19 is not the memory card 19a that was connected for the first time (No at S730), the control unit 25 executes the restart processing illustrated in FIG. 7 at S750.

After the end of the restart processing, further, the control unit 25 checks if the refresh operation is completed for the memory card 19a (specifically, if Yes is rendered at S690 or S645 and if the restart processing has finished) in the preceding restart processing. If it is determined that the refreshing operation has been completed (Yes at S753), the control unit 25 executes processing corresponding to the refreshing operation that is completed based on the rewrite progress data stored in the NVRAM 25c and, thereafter, erases the rewrite progress data from the NVRAM 25c (S757).

Specifically, after the refreshing operation (rewrite control processing) started in the card management processing is completed and after all of the blocks are refreshed in the memory card 19a, the date and hour of writing data and stored in the predetermined region of the memory card 19a are updated to the present date and hour, and the unupdated flag is reset like the processing at S247 in the first embodiment.

After the processing at S757 as described above, the control unit 25 starts executing the card management processing illustrated in FIG. 4 at S760. Thereafter, the after-start processing ends.

In the navigation device 1, further, the control unit 25 separately sets, into the rewrite region, the blocks in the memory card 19a that are highly frequently read out and executes the rewrite control processing (details will be described later). Therefore, when the refreshing operation executed in the restart processing due to the interruption of the rewrite control processing is completed and when the blocks set to the rewrite region are refreshed, the read counter CN corresponding to the refreshed blocks are reset to zero and the rewrite progress data are erased from the NVRAM 25c without updating at S757 the date and hour of writing data in the memory card 19a. Thereafter, after having started the execution of the card management processing illustrated in FIG. 4 at S760, the after-start processing ends.

In the restart processing, on the other hand, if the refreshing operation has not been completed for the memory card 19a (i.e., if No is rendered at S610 or Yes is rendered at S625 or S675 and if the restart processing has been finished) (No at S753), then S760 is executed without executing the processing of S757. Here, however, if Yes is rendered at S625 or S675, the after-start processing ends without executing the processing of S760, and the navigation device 1 is turned off.

In the navigation device 1 of this embodiment as described above, the data which are highly frequently read out from the memory card 19a are separately rewritten and are refreshed. This operation is realized by the control unit 25 which executes read control processing illustrated in FIG. 9. That is, the various programs executed by the control unit 25 are basically different from those of the first embodiment; i.e., a program is called for realizing the read control processing illustrated in FIG. 9, and the data stored in the memory card 19a are obtained through the read control processing.

Next, the content of the read control processing will be described with reference to FIG. 9. This processing is executed by the control unit 25 upon receipt of a read instruction from such a task as route guide processing task or map display processing task.

Upon the start of the read control processing responsive to the read instruction, the control unit 25 reads, from the memory card 19a, the data of an object to be read out specified by the read instruction, and hands the data over to a task from where the read instruction was issued. In this embodiment, if referred to here, the RAM 25b is not provided with the above particular region unlike that of the first embodiment.

After this processing, further, the control unit 25 checks if the data of the object to be read out are those data that are set to be the monitor object (S820). If it is determined that the data of the object to be read out are not the data set to be the monitor object (No at S820), the read control processing ends without executing the processing of S830 to S860.

On the other hand, if it is determined that the data of the object to be read out are the data set to be the monitor object (Yes at S820), the control unit 25 at S830 counts up by 1 the read counter CN of a block corresponding to the data that are read out (CN←CN+1).

In this embodiment, the read counters CN are assigned to the blocks of the memory card 19a storing the data of the monitor object, and the read counters CN of the blocks are stored in the NVRAM 25c. The read counters CN are read out into the RAM 25b from the NVRAM 25c, and are counted up every time when the corresponding data are read out by the read control processing. The values after counted up are regularly written into the NVRAM 25c and are reflected on the read counters CN stored in the NVRAM 25c.

If the read counter CN is updated (counted up) at S830, the control unit 25 checks if the updated read counter CN (read counter CN of a block corresponding to the data that are read out) has exceeded a predetermined threshold value (S840). If it is determined that the read counter CN is equal to or smaller than the threshold value (No at S840), the read control processing ends without executing the processing of S850 to S860.

On the other hand, if it is determined that the read counter CN has exceeded the threshold value (Yes at S840), the control unit 25 at S850 sets the block corresponding to the read counter CN that has exceeded the threshold value (i.e., the block of data read out from the memory card 19a at S810) into the rewrite region and executes the rewrite control processing illustrated in FIG. 5. Therefore, the data of the object to be read out in the memory card 19a are refreshed. After the end of the rewrite control processing, the value of the read counter CN of the block of which the data are refreshed is reset to zero (S860). Further, the rewrite progress data are erased from the NVRAM 25c. Thereafter, the read control processing ends.

In case the rewrite control processing is interrupted at S850, however, the control unit 25 ends the read control processing without executing the processing at S860 and, thereafter, turns the navigation device 1 off.

Further, in case the refresh operation (rewrite control processing) started in the read control processing is interrupted, the control unit 25 starts the refresh operation that was interrupted in the restart processing (S750) when the navigation device 1 is turned on next to refresh the data in the corresponding block.

After the completion of the refresh operation, the value of the read counter CN of the block that is refreshed is reset to zero at S757 as described above. Moreover, though not described, in this embodiment, the read counter CN is reset to zero even when the refresh operation started in the card management processing is completed. Specifically, when the date and hour of writing data are to be updated at S350 or S757, the read counters CN corresponding to the data to be monitored are all reset to zero. The read counters CN are thus managed in this embodiment.

In the second embodiment as described above, the whole memory card 19a is refreshed every time when a predetermined period of time has passed, and the data to be monitored are refreshed every time when the reading frequency exceeds the threshold value.

If the frequencies for reading data of the blocks are not even, the data of blocks that are highly frequently read out become more volatile than the data of other blocks. Therefore, if the data of the blocks stored in the memory card 19a are simply refreshed every predetermined period of time, it becomes probable that the data volatilize in the blocks that are highly frequently read out unless the data are updated redundantly depending upon the reading frequency of those blocks that are highly frequently read out.

In view of the above problem, in this embodiment, the data that are estimated to be highly frequently read out are set in advance to be the objects that are to be monitored, and the data of the blocks storing the data to be monitored are separately refreshed every time when the reading frequency exceeds the threshold value. Therefore, even when the reading frequencies are not even, the data in the memory card 19a are efficiently updated to prevent the data from volatilizing as much as possible. Further, redundantly updating the data suppresses an increase in the frequency of writing and suppresses the life of the memory card 19a from shortening.

Here, the whole data in the memory card 19a are collectively managed and are refreshed every time when the passage of time from the date and hour of writing data exceeds the threshold value. In the navigation device 1, however, the data related to the date and hour of writing data and to the unupdated flag may be recorded in the memory card 19a for every block or for every predetermined number of blocks, and the data of the blocks that have exceeded the threshold value may be selectively refreshed for every block or for every predetermined number of blocks every time when the threshold value is exceeded by the passage of time from the date and hour of writing data.

The data to be monitored are individually refreshed by the read control processing. Therefore, the following problem arises if the whole data in the memory card 19a are collectively managed by the card management processing and are refreshed every time when the threshold value is exceeded by the passage of time from the date and hour of writing data. That is, immediately after the rewrite control processing is executed by the read control processing, the rewrite control processing is executed by the card management processing and the data to be monitored are redundantly updated.

The card management processing executes the refreshing operation after a relatively long time period such as one year, and redundantly updating the data does not cause any serious matter. However, the redundancy can be improved if the data of those blocks of which the passage of time from the date and hour of writing data has exceeded the threshold value are refreshed for every block or for every predetermined number of blocks as described above.

Moreover, among the data stored in the memory card 19*a*, only part of the data is set to be monitored and the above processing is executed. However, the data may not be set to be monitored but, instead, the data of all blocks in the memory card 19*a* may be put to the processing same as the one for those that are to be monitored as described above. In this case, further, the refreshing operation may not be executed by the card management processing.

By thus configuring the program to be executed by the control unit 25, the data of the blocks forming the memory card 19*a* can be individually refreshed depending upon the frequencies of reading.

Further, since the data that are highly frequently read out are estimated from the data related to the registered point and are simply set to be monitored, suitable data are not necessarily set to be monitored at all times. For instance, the monitor object cannot be suitably set in the navigation device 1 of a user who does not use the function for registering the point.

Figure 10A:
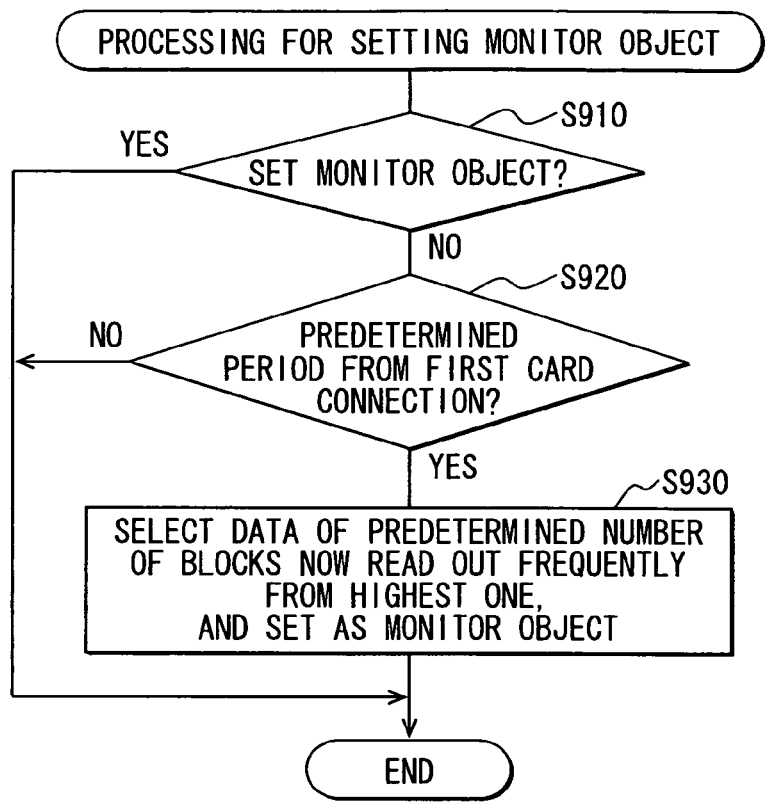
FIG. 10A is a flowchart illustrating the monitor object setting processing according to a modified embodiment.

Therefore, the processing for setting a monitor object executed at S710 may be changed into processing for setting a monitor object illustrated in FIG. 10A.

Upon the start of this processing, the control unit 25 checks if the monitor object is set to the memory card 19*a* which is now connected to the card slot portion 19 (S910). If it is determined that the monitor object has been set (Yes at S910), the processing for setting a monitor object ends without executing processing after S920. In this modified embodiment, the monitor object will be set at S930 that will be described later.

On the other hand, if it is determined that the monitor object has not been set yet (No at S910), the control unit 25 determines at S920 if the predetermined period of time has passed from the moment when the memory card 19*a*, which has now been connected to the card slot portion 19, was for the first time connected to the card slot portion 19 (S920).

If it is determined that the predetermined period of time has not passed (No at S920), the processing for setting a monitor object ends, processing is executed for counting up by 1 the read counter CN of a block corresponding to the data read out every time when the data is read out from the memory card 19*a*, and the frequency of reading data of each of the blocks in the memory card 19*a* is counted until the predetermined period of time passes from the moment of the first connection.

Figure 9:
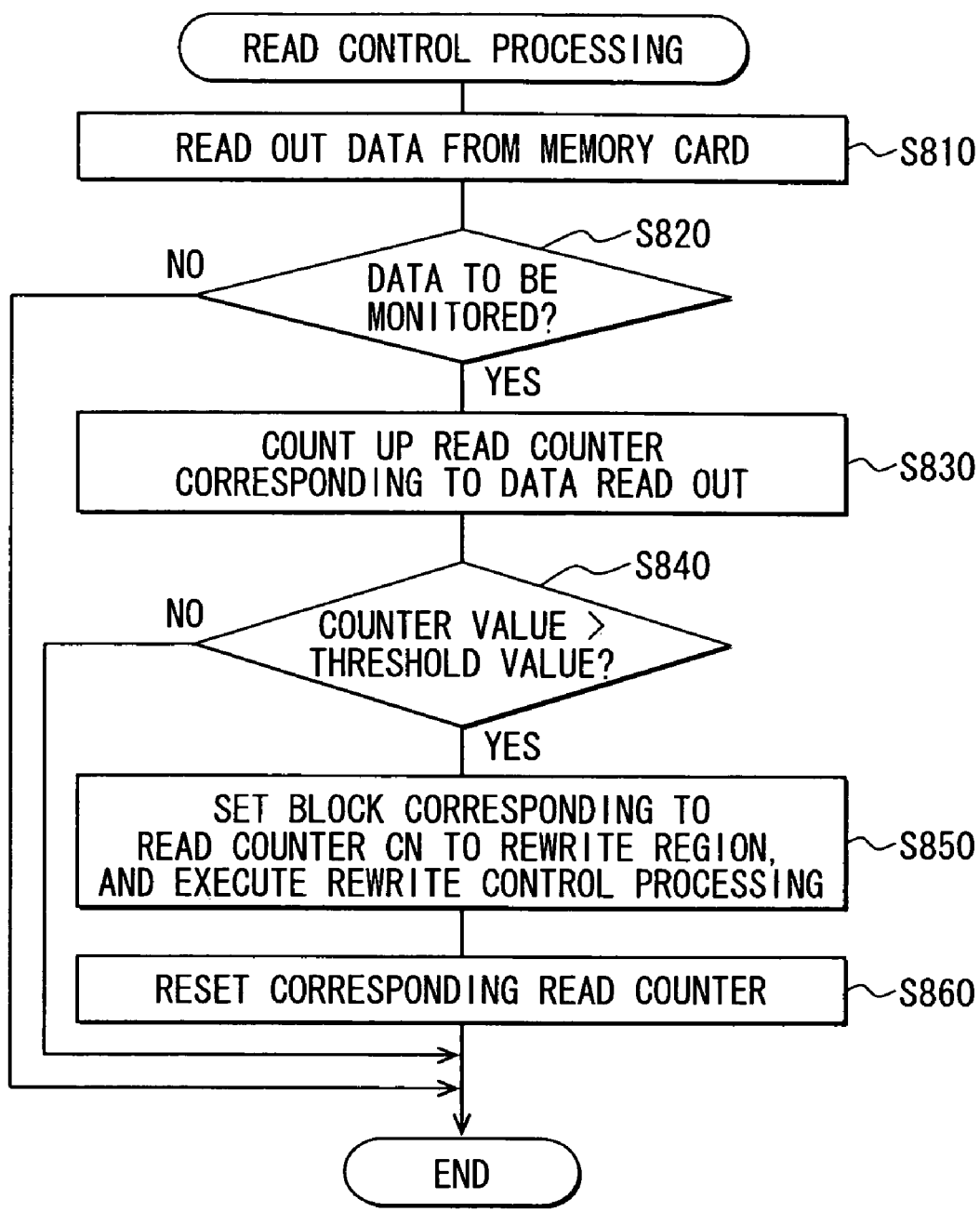
FIG. 9 is a flowchart illustrating the read control processing according to the second embodiment.
Figure 10B:
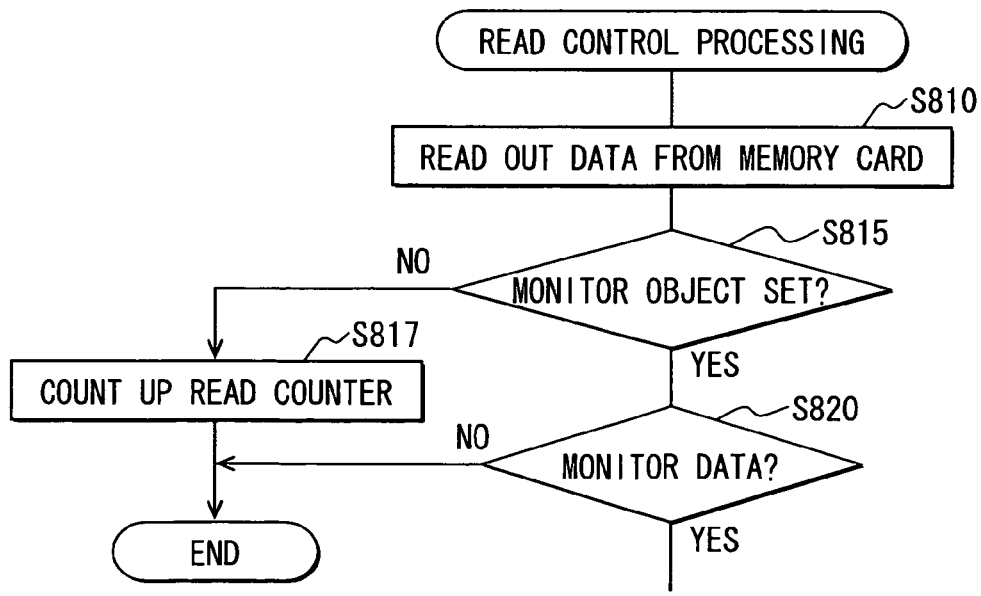
FIG. 10B is a flowchart illustrating the read control processing according to the modified embodiment.

Specifically, the read control processing illustrated in FIG. 10B is executed instead of the read control processing illustrated in FIG. 9 to execute the processing for counting up by 1 the read counter CN of a block corresponding to the data that was read out. In the read control processing, the processing after S820 are the same as those of the read control processing illustrated in FIG. 9. Therefore, FIG. 10B does not illustrate the processing after S830.

Referring to FIG. 10B, the control unit 25 executes processing for reading, from the memory card 19*a*, the data that are to be read out specified by a read instruction and for handing the data over to the task from where the reading instruction was issued. Thereafter (S810), the control unit 25 determines at S815 if the monitor object has been set to the memory card 19*a*.

If it is determined that the monitor object has been set (Yes at S815), S820 is executed. If it is determined that the monitor object has not been set (No at S815), on the other hand, the read counter CN of a block corresponding to the data that were read out is counted up by 1 (S817). Thereafter, the read control processing ends. In this modified embodiment, the read counters CN have been assigned to the blocks forming the memory card 19*a*.

As described above, the control unit 25 continues to count the frequencies for reading data of the blocks forming the memory card 19*a* for a period of time until the predetermined period of time passes from the moment the memory card 19*a* was connected for the first time (S817).

When the navigation device 1 is turned on for the first time after the passage of a predetermined period of time from the moment the memory card 19*a* was connected for the first time, Yes is rendered at S920 and at this moment, the data of a predetermined number of blocks having large values of read counters CN are set to be the monitor objects (S930). Thereafter, the data set to be monitored are saved in the NVRAM 25*c*. From the next time on, when the navigation device 1 is turned on, Yes is rendered at S910, and the data set thus far to be monitored are refreshed every time when the values of the read counters CN exceed the threshold value.

According to this modified embodiment, if the data that are highly frequently read out are set to be the monitor objects to be monitored during the period until the predetermined period of time passes from when the memory card 19*a* was connected for the first time, the monitor objects can be suitably set depending upon the method used by the user, and the volatilization of data can be prevented more suitably.

In this embodiment, the function of means for counting the reading frequency can be realized by the processing at S830 executed by the control unit 25, and the function of the update control means can be realized by the processing of S820 and S840 to S850. Further, the function of means for setting an object to be monitored is realized by the processing of S710.

Third Embodiment

The navigation device 1 of a third embodiment is similar to the navigation device 1 of the first or second embodiment, but has additional functions. Here, only those processing related to the additional functions will be selectively described.

Figure 11:
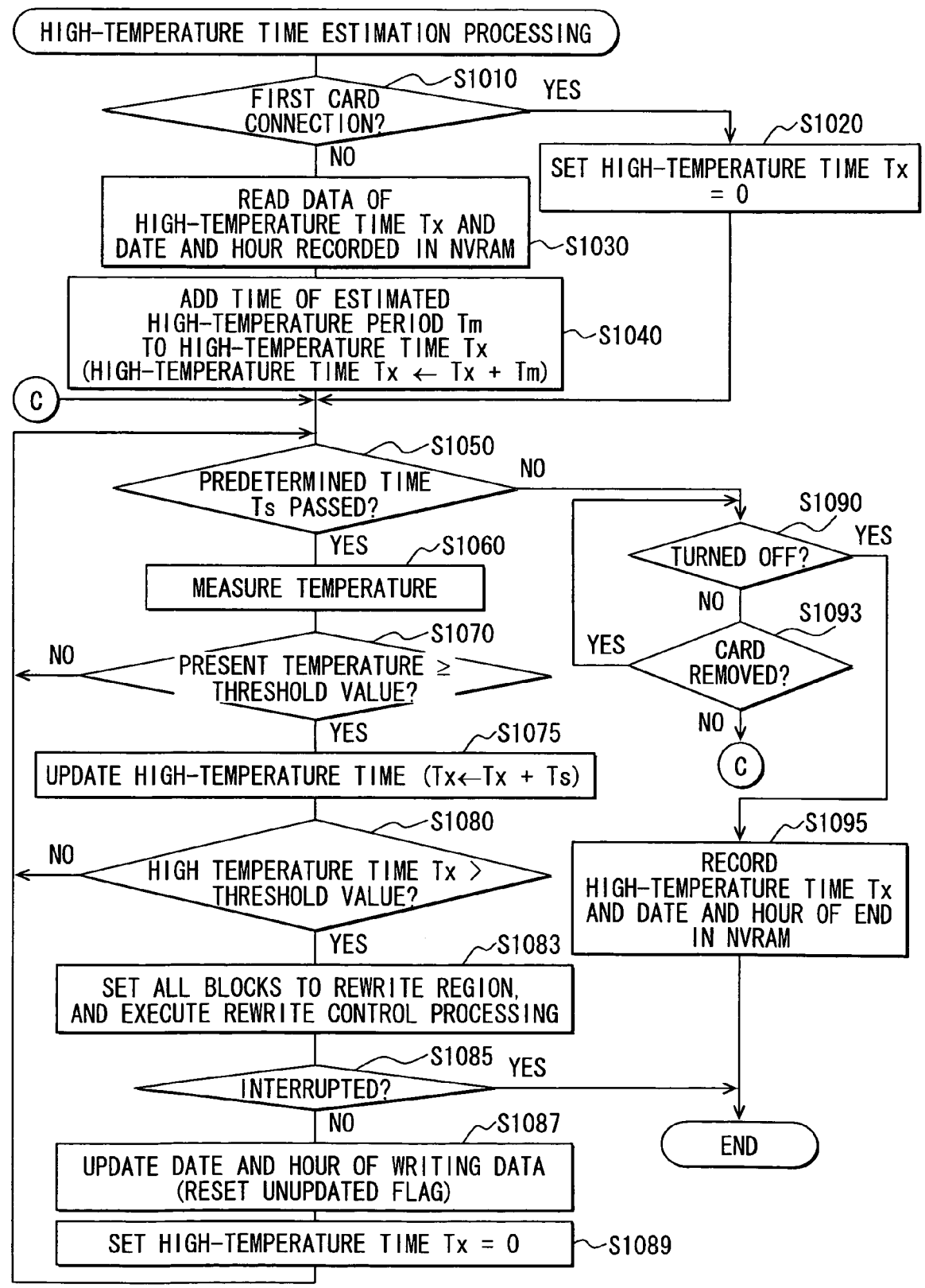
FIG. 11 is a flowchart illustrating high-temperature time estimation processing executed by the control unit.

The navigation device 1 is so configured that a temperature sensor (not shown) is incorporated in the card slot portion 19, and the control unit 25 executes high-temperature time estimation processing illustrated in FIG. 11 based on the temperature data around the card slot portion acquired from the temperature sensor.

Specifically, the control unit 25 starts the high-temperature time estimation processing together with the card management processing at S250 or S760 in the after-start processing.

Upon the start of the high-temperature time estimation processing, the control unit 25, first, checks if the memory card 19*a* connected to the card slot portion 19 is the one that was connected to the card slot portion 19 for the first time (S1010).

Specifically, here, the control unit 25 checks if the data (described later in detail) related to the high-temperature time Tx and the date and hour of an end in the memory card 19*a* now connected have been recorded in the NVRAM 25*c* to thereby check if the memory card 19*a* connected to the card slot portion 19 is the one that was connected for the first time to the card slot portion 19.

If it is determined that the memory card 19*a* is the one that was connected to the card slot portion 19 for the first time, the high-temperature time Tx is set to 0 (S1020), and S1050 is executed. After S1050, the ambient temperature is measured every predetermined period of time Ts by using the temperature sensor, and the operation is effected to update the high-temperature time Tx based on the temperature data.

Specifically, upon executing S1050, the control unit 25 checks if the predetermined period of time Ts has passed from a moment the ambient temperature was measured and the temperature data was obtained last time. At S1050 immediately after the navigation device 1 was turned on, however, it is formally determined that the predetermined period of time Ts has passed.

After it is determined that the predetermined period of time Ts has passed (Yes at S1050), the ambient temperature is measured by using the temperature sensor and the temperature data is obtained from the temperature sensor (S1060). After this processing, it is checked if the ambient temperature of the card slot portion 19 is equal to or higher than a threshold value based on the obtained data (S1070). Here, the threshold value has been set in advance in the stage of design to be a temperature (e.g., 80 degrees in centigrade) at which a drop of retention of the memory card 19a cannot be neglected.

If it is determined that the ambient temperature is lower than the threshold value (No at S1070), the control unit 25 executed S1050, S1075 is executed if the control unit 25 determines that the ambient temperature is not lower than the threshold value (Yes at S1070). At S1075, further, the above time Ts is added to the high-temperature time Tx that has now been set to update the high-temperature time Tx (Tx←Tx+Ts).

Further, if the processing at S1075 ends, the control unit 25 checks if the present high-temperature time Tx is in excess of a predetermined threshold value (S1080). If it is determined that the high-temperature time Tx is equal to or smaller than the threshold value (No at S1080), S1050 is executed, S1083 is executed if it is determined that the high-temperature time Tx is in excess of the threshold value (Yes at S1080). At S1083, further, all of the blocks in the memory card 19a are set to the rewrite region, and the rewrite control processing illustrated in FIG. 5 is executed. Therefore, the whole data in the memory card 19a are refreshed.

If the rewrite control processing ends accompanying the end of the rewrite processing for all of the blocks, the control unit 25 renders the negative determination at S1085, updates the date and hour of writing data and stored in the memory card 19a to the present date and hour (S1087), and resets the unupdated flag. The control unit 25, further, erases the rewrite progress data and, further, resets the high-temperature time Tx to zero (S1089). Thereafter, S1050 is executed.

On the other hand, if the rewrite control processing is interrupted at S1083, the control unit 25 renders the affirmative determination at S1085, ends the high-temperature time estimation processing, and turns the navigation device 1 off. When the navigation device 1 is turned on next time, the refresh operation that was interrupted is resumed in the restart processing. At a moment the refreshing operation ends, the date and hour of writing data are updated, unupdated flag is reset, the high-temperature time Tx is reset to zero, and the rewrite progress data are erased (S247, S757). Here, when the date and hour of writing data in the memory card 19a are to be updated at S247, S350 and S757, etc., the high-temperature time Tx of the memory card 19a is necessarily reset to Tx=0.

Further, if it is determined at S1050 that the predetermined period of time Ts has not passed, the control unit 25 determines at S1090 if the ACC switch is turned off and, therefore, if the navigation device 1 is turned off. If it is determined that the navigation device 1 has not been turned off (No at S1090), the control unit 25 checks if the memory card 19a is removed from the card slot portion 19 (S1093). If the memory card 19a has not been removed from the card slot portion 19 (No at S1093), S1050 is executed.

On the other hand, if it is determined that the memory card 19a has been removed from the card slot portion 19 (Yes at S1093), the control unit 25 stands by until the turn-off operation is effected at S1090 or until the same memory card 19a is connected to the card slot portion 19. Upon connecting the same memory card 19a to the card slot portion 19 (No at S1093), S1050 is executed, S1095 is executed if the turn-off operation is executed (Yes at S1090).

Further, upon executing S1095, the control unit 25 records, in the NVRAM 25c, the data of the high-temperature time Tx at present of the memory card 19a connected this time, and records the present date and hour in the NVRAM 25c as the data related to the date and hour that the processing for estimating high-temperature time has finished. Thereafter, the processing for estimating the high-temperature time ends.

Further, if it is determined at S1010 that the memory card 19a is not the one that was connected to the card slot portion 19 for the first time (No at S1010), the control unit 25 reads, from the NVRAM 25c, the data related to the high-temperature time Tx and the date and hour of an end in the memory card 19a written in the NVRAM 25c when the navigation device 1 was turned off last time (S1030), and newly sets the high-temperature time Tx based upon the data of the high-temperature time Tx and the date and hour of an end that are read out and upon the data of the estimated high-temperature period stored in the memory card 19a (S1040).

The data of the estimated high-temperature period represent a period in which the temperature in the compartment is estimated to be nearly the same as the threshold value used at S1070 (i.e., estimated high-temperature period). Here, the times of from 7:00 to 19:00 in July to September are defined to be the estimated high-temperature periods.

That is, at step S1040, if the estimated high-temperature period defined by the data of the estimated high-temperature period is present in a period of from the date and hour of an end represented by the above data that are read out up to the present date and hour, the control unit 25 calculates the total time Tm of the estimated high-temperature periods which present in the period of from the date and hour of an end represented by the above data that are read out up to the present date and hour, adds the total time Tm to the high-temperature time Tx read out from the NVRAM 25c, and sets the added value as the high-temperature time Tx (Tx←Tx+Tm).

If the date and hour of an end are 20:00, July 10 and the present date and hour are 8:00, July 13, a period of from 7:00 to 19:00 in July 11, a period of from 7:00 to 19:00 in July 12 and a period of from 7:00 to 8:00 in July 13 represent the estimated high-temperature periods. Therefore, Tm is calculated to be 25 hours to set the high-temperature time Tx.

Further, if the processing at S1040 ends as described above, the control unit 25 executes the processing after S1050 as described above starting from the high-temperature time Tx set at S1040 and updates the high-temperature time Tx. At a moment when the high-temperature time Tx has exceeded the threshold value (Yes at S1080), the blocks in the memory card 19a are all set to the rewrite region, and the rewrite control processing illustrated in FIG. 5 is executed (S1083). Thus, the whole data in the memory card 19a are refreshed.

In this embodiment, the card management processing and the high-temperature time estimation processing are executed in parallel, and the refreshing operation for the memory card 19a starts at different timings. In the card management processing and high-temperature time estimation processing, therefore, if the refreshing operation has already been started by any other processing, the rewrite control processing is not executed to avoid the simultaneous start of refresh operations in the card management processing and in the high-temperature time estimation processing.

For example, if the refreshing operation (rewrite control processing) has been started in the high-temperature time estimation processing, the negative determination is formally rendered in the card management processing at S325 and S330 so that the rewrite control processing is not executed. Further, if the refresh operation has been started in the card management processing, the negative determination is formally rendered in the high-temperature time estimation processing at S1080 so that the rewrite control processing is not executed.

In the navigation device 1 as described above, the time in which the memory card 19a is placed in a high-temperature environment is estimated as the high-temperature time Tx, and the refreshing operation is started for the memory card 19a every time when the time Tx has exceeded the threshold value. In particular, the time in which the memory card 19a is exposed to high temperatures when the navigation device 1 is turned off is estimated based on the data of the estimated high-temperature period.

Therefore, the data in the memory card 19a can be updated at a suitable timing to meet a drop of retention caused by high temperatures, and the data are prevented from volatilizing when the memory card 19a is exposed in a high-temperature environment.

In this embodiment, the function of the update control means is realized by the processing at S1080, and the function of the data updating means is realized by the rewrite control processing which the control unit 25 executes at S1083, by the processing at S1087 and the like. Further, the function of the high-temperature time estimation means is realized by the processing at S1020, S1040, S1075, S1089 and the like.

Fourth Embodiment

The navigation device 1 of a fourth embodiment, too, is similar to the navigation device 1 of any one of the above first to third embodiments but has further additional functions. Here, the additional functions will be selectively described.

As a prerequisite, first, important data are determined in advance in the stage of designing, and are double-written into the memory card 19a. That is, the same data which are the important data are written in a plural way into the memory card 19a before the shipment. Here, for example, programs, map management data and the like can be regarded to be important data.

Figure 12:
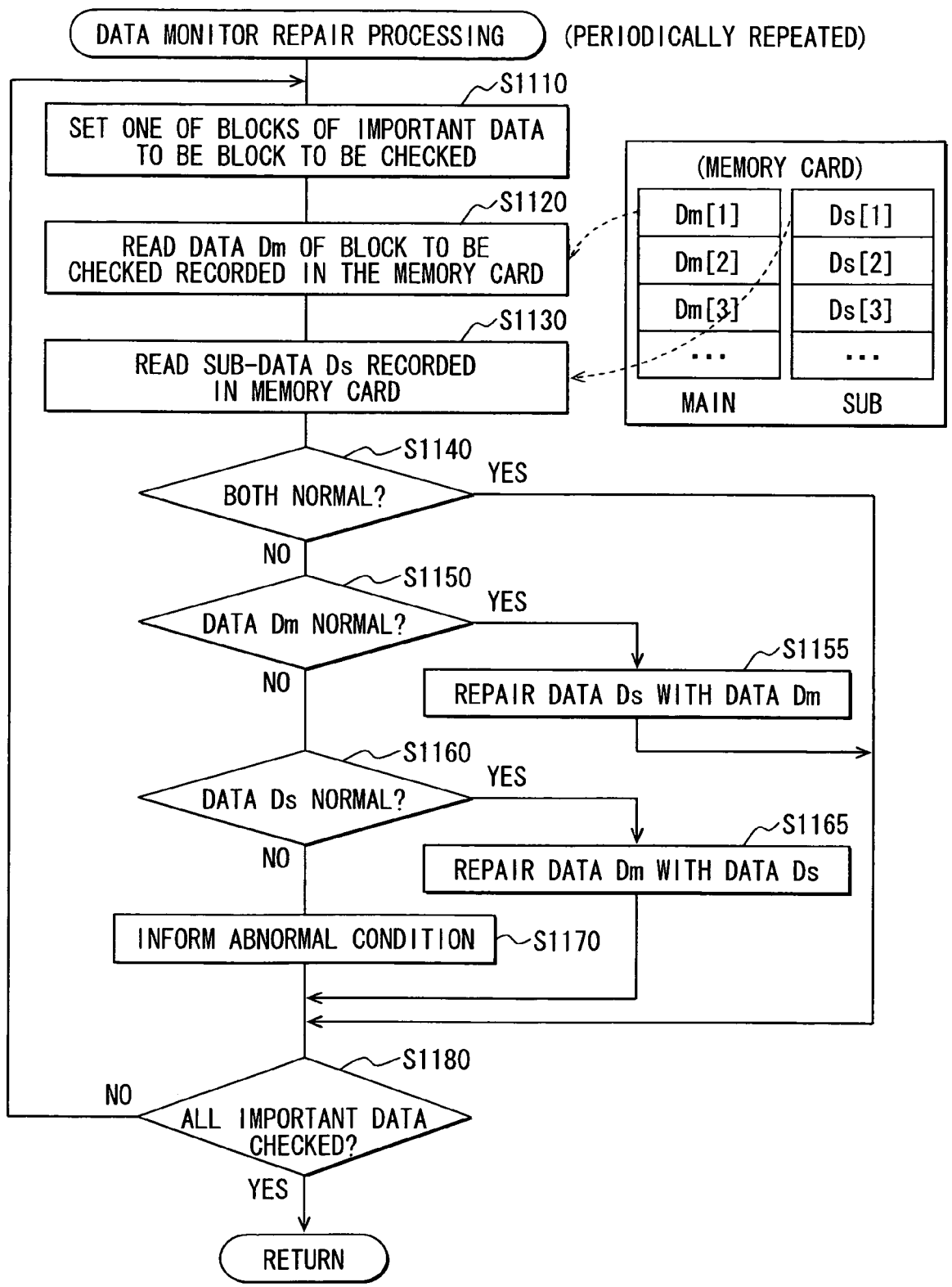
FIG. 12 is a flowchart illustrating data monitor repair processing executed by the control unit.

Further, a program is so designed that upon the connection of the memory card 19a, the control unit 25 periodically repeats the processing illustrated in FIG. 12, the program being recorded in the memory card 19a or in the ROM. In this embodiment as described above, even if one of the important data becomes abnormal, the data that became abnormal can be repaired based on the same data that is normal.

Upon the start of the data monitor repair processing of FIG. 12, the control unit 25 sets one of the blocks storing the important data to be a block that is to be checked (S1110), and reads the data stored in the block to be checked from the memory card 19a (S120). Further, at the time of writing the data, the control unit 25 reads, from the memory card 19a, the data of a block to which are written the same data as those of the block to be checked (S1130). Hereinafter, the data read out at S1120 are referred to as main data and the data read out at S1130 are referred to as sub-data.

After the end of the processing at S1130, the control unit 25 checks if the main data and the sub-data read out from the memory card 19a are both normal data that have not been volatilized (S140). If the data that are read out are normal data or not can be determined by using a known technology such as a checksum or the like.

If it is determined that the main data and the sub-data that are read out are both normal data (Yes at S1140), S1180 is executed.

On the other hand, if it is determined that at least either the main data or the sub-data that are read out are not the normal data (No at S1140) and if it is determined that the sub-data are not the normal data but the main data are the normal data (Yes at S1150), then the data of a block storing the sub-data in the memory card 19a are rewritten into the main data that are read out, and the data of the block storing the sub-data are repaired into normal value (S1155). Thereafter, S1180 is executed.

Further, if it is determined that at least either the main data or the sub-data that are read out are not the normal data (No at S1140) and if it is determined that the main data are not the normal data but the sub-data are the normal data (No at S1150, Yes at S1160), then the control unit 25 rewrites the data of the block to be checked storing the main data in the memory card 19a into the sub-data that are read out, and repairs the data of the block to be checked into normal value (S1165). Thereafter, S1180 is executed.

Further, if it is determined that both the main data and the sub-data are not normal data (No at S1160), a message stating that the memory card 19a is abnormal is displayed on the display portion 21 to inform the user of abnormal condition (S170). Thereafter, S1180 is executed.

Further, upon executing S1180, the control unit 25 checks if the blocks storing the important data are generally set to be the blocks to be checked. If they have not been generally set to be the blocks to be checked, one of the blocks that have not been set to be the block to be checked is set to be a block to be checked at S1110. Thereafter; the processing after S1120 are executed. In the data monitor repair processing, however, only one of the pair of blocks storing the same important data is set to be a block to be checked.

If it is determined that the blocks storing important data are generally set to be the blocks to be checked (S180), the data monitor repair processing ends. The control unit 25 periodically repeats the data management repair processing having the above content.

As described above, the navigation device 1 is storing the important data being double-written into the memory card 19a. Therefore, even in case one of the important data becomes abnormal being caused by, for example, volatilization of data, the abnormal condition can be repaired. Therefore, an excellent navigation device 1 having strong durability against the volatilization of data can be offered to the users.

The function of the data repairing means is realized by the data monitor repair processing executed by the control unit 25.

Fifth Embodiment

The navigation device 1 of a fifth embodiment, too, has a hardware configuration which is the same as that of the navigation device 1 of the first embodiment. Described below selectively are portions different from those of the first embodiment in the contents of processing realized by the control unit 25 in a software manner.

First, outline of the fifth embodiment will be described. In the first embodiment, the data in the block to be processed were backed up in the NVRAM 25c in the rewrite control processing to cope with a sudden shut down of the navigation device 1. To back up the data, however, a region for the data must be secured in the NVRAM 25c.

In a flash memory as is well known, to overwrite new data into a block into which the data have been written already, the block as a whole must be once erased prior to writing the new data; i.e., the new data cannot be simply overwritten therein. Therefore, at the time of rewriting the data of the block to be processed into the memory card 19a (for example, in executing S440), the data in the block to be processed are, first, erased.

Therefore, if a shut down suddenly occurs in the period of from this moment until the rewriting into the block to be processed is completed (period until the affirmative determination is rendered at S470), the block to be processed assumes a state where the data are partly erased.

Because of this reason in the first embodiment, the data in the block to be processed are backed up in the NVRAM 25c in the rewrite control processing. To back up the data, however, the control unit 25 must be provided with the NVRAM 25c of a fairly large capacity for securing the region for backing up. This method adds the cost of producing the product (navigation device 1).

According to the fifth embodiment, therefore, the navigation device 1 is so configured that the data in the block to be processed are not backed up in the NVRAM 25c but, instead, the data in the block to be processed are not rewritten into the memory card 19a in an environment where the navigation device 1 is highly probable to be suddenly shut down.

Figure 13A:
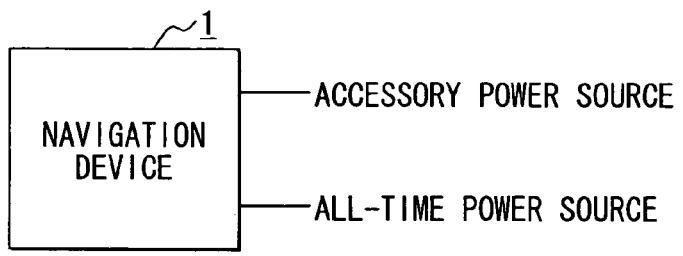
FIG. 13A is a diagram illustrating the connection of a power source.

As shown in FIG. 13A, like the navigation device 1 of the first embodiment, the navigation device 1 is connected to the accessory power source that feeds the electric power being linked to the on/off operation of the accessory (ACC) switch and to the all-time power source which continuously feeds the electric power so far as the battery is connected thereto, starts working if the accessory switch is turned on and, if the accessory switch is turned off, executes the end processing such as S520 to S550 owing to the all-time power source.

Figure 13B:
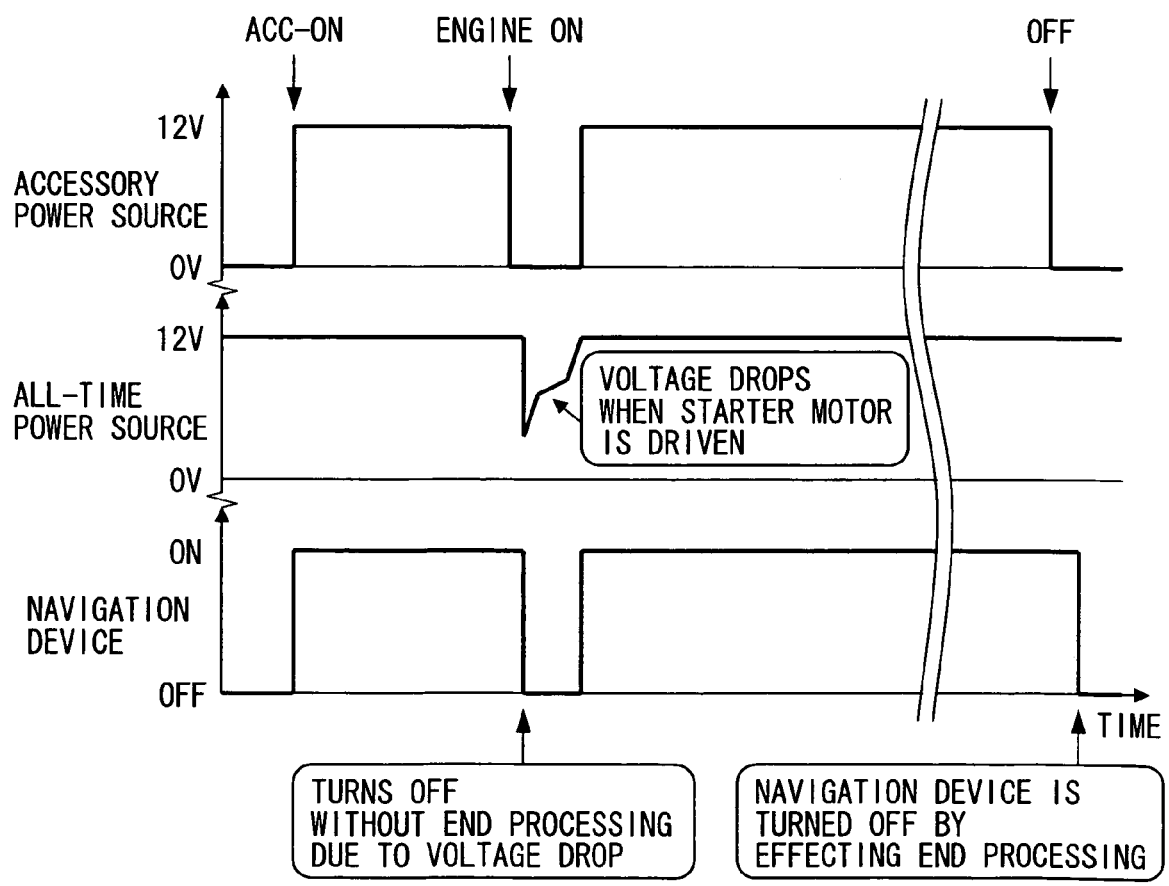
FIG. 13B is a time chart illustrating changes in the voltage of an accessory power source and of an all-time power source.

As is well known, however, at the start of the engine, the voltage drops as shown in FIG. 13B being caused by the rotation of a starter motor or the like, and, therefore, the navigation device 1 is probable to be suddenly shut down without normally executing the end processing.

In this case, the navigation device 1 comes into a halt without completing the rewrite processing for the blocks to be processed, and the data will be lost from the memory card 19a. This problem, further, occurs when the battery itself is removed from the vehicle by the user in addition to when the voltage has dropped down.

However, the sudden shutdown generally occurs at the time of cranking (when the starter motor rotates) or when the battery is removed, i.e., when the vehicle is at rest.

That is, when the vehicle is traveling at high speeds, the engine is running already and the voltage drop due to the cranking does not occur. When the vehicle is traveling at high speeds, further, it does not usually happen that the user opens the hood of the vehicle to remove the battery.

In this embodiment, therefore, while the vehicle is traveling at low speeds, the data in the block to be processed are not rewritten into the memory card 19a and only when the vehicle is traveling at high speeds, the data in the block to be processed are rewritten into the memory card 19a.

Figure 14:
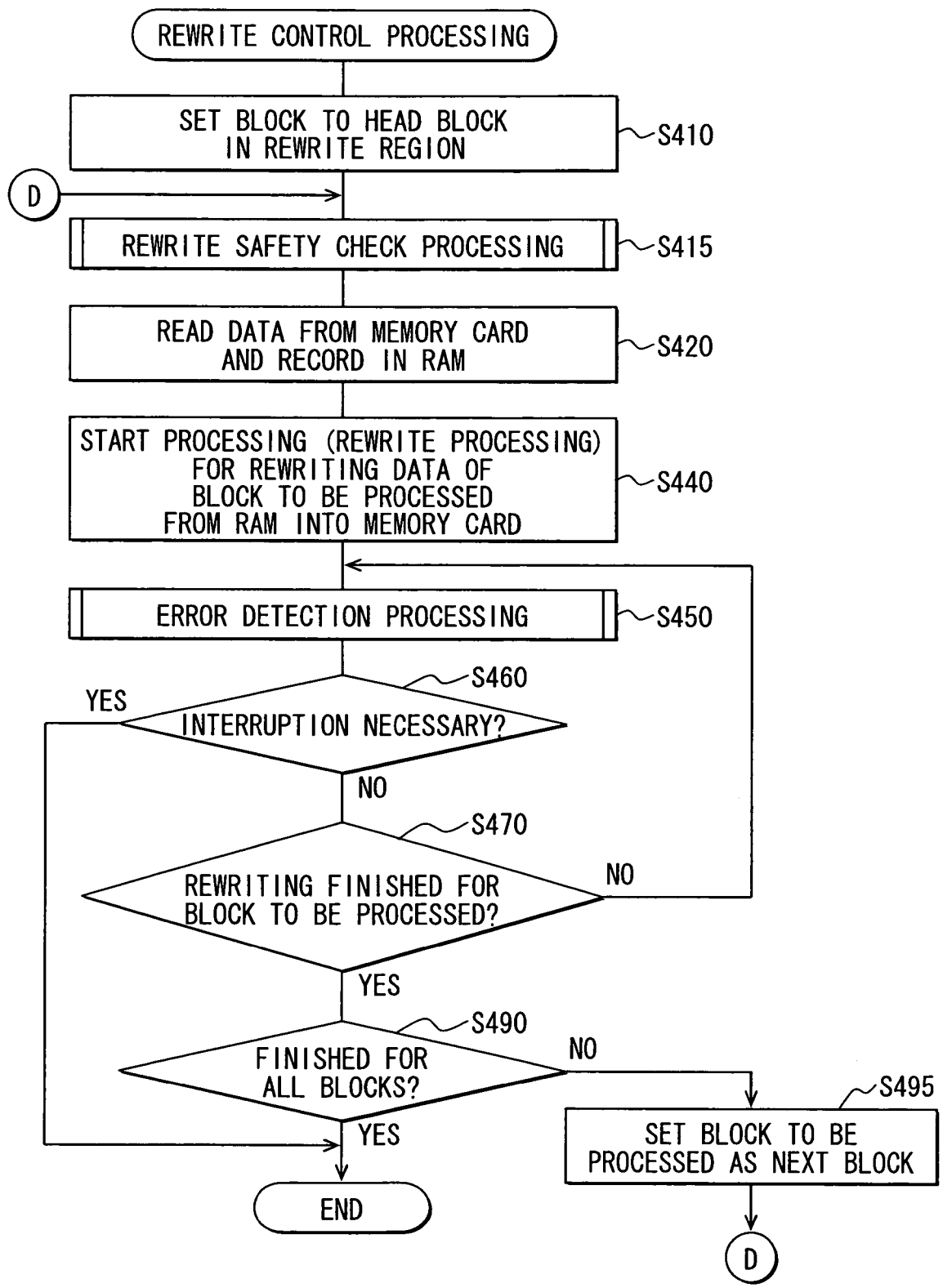
FIG. 14 is a flowchart of the rewrite control processing of a fifth embodiment.

Specifically, the control unit 25 realizes the above function by executing the rewrite control processing illustrated in FIG. 14 instead of executing the rewrite control processing illustrated in FIG. 5.

Like in the first embodiment, the control unit 25 executes the read control processing illustrated in FIG. 2, the start processing illustrated in FIG. 3, and the card management processing illustrated in FIG. 4 and, further, executes the rewrite control processing illustrated in FIG. 14 at S340 in the card management processing.

Figure 15A:
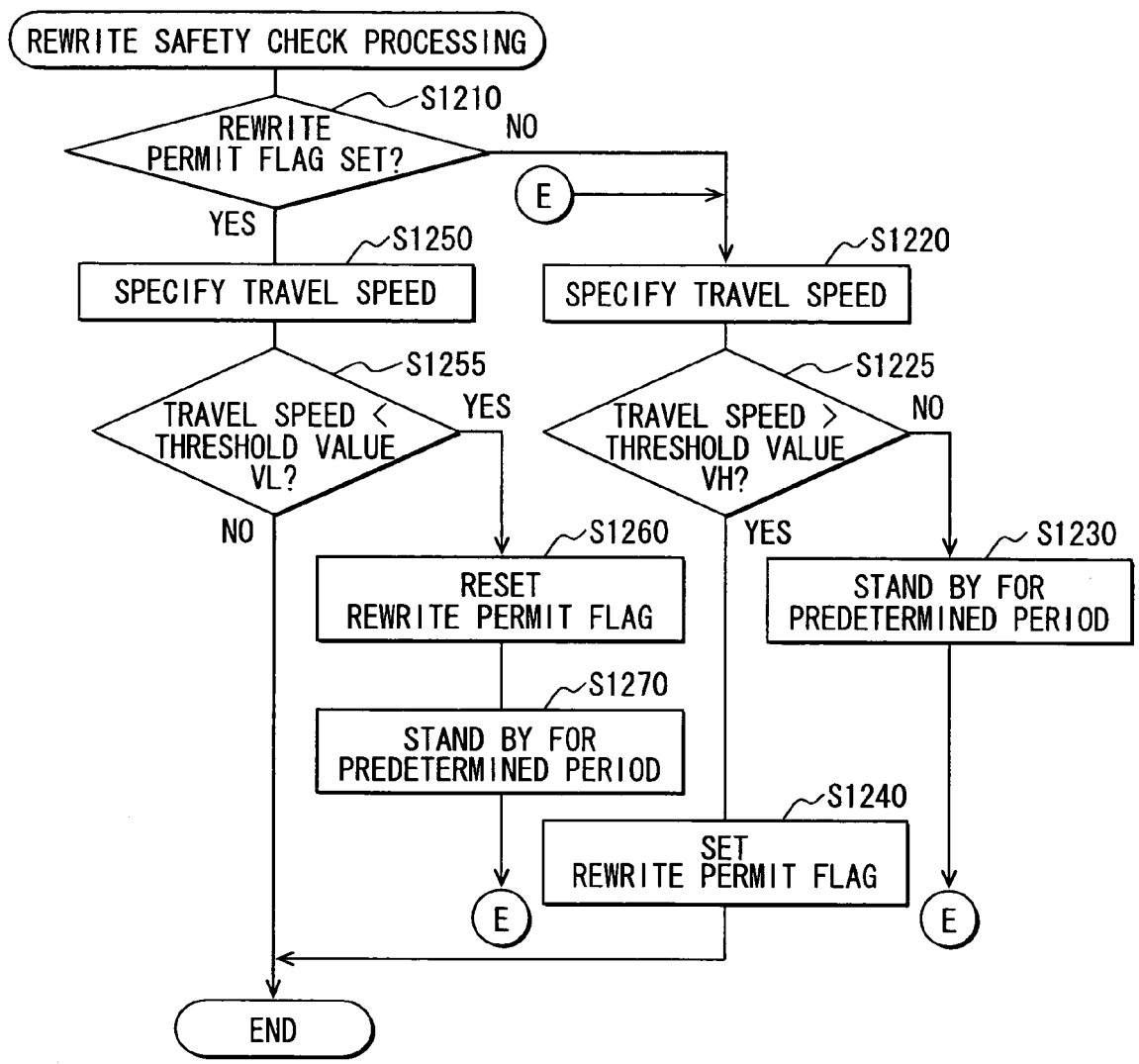
FIG. 15A is a flowchart illustrating rewrite safety check processing executed by the control unit.

Upon the start of the rewrite control processing, the control unit 25, like in the first embodiment, executes the processing of S410 and, thereafter executes at 415 the rewrite safety check processing illustrated in FIG. 15A.

Upon the start of the rewrite safety check processing at S415, the control unit 25, first, checks if a rewrite permit flag is set (S1210). The rewrite permit flag is a flag representing that the rewriting is permitted in a set state, and is reset at the start of the navigation device 1. That is, after the start of the navigation device 1, it is determined at S1210 in the first rewrite control processing that the rewrite permit flag has been reset.

Upon determining that the rewrite permit flag has been reset (No at S1210), the control unit 25 at S1220 specifies the present travel speed of the vehicle. For example, the travel speed of the vehicle is found from a signal detected by the position detector 11 (distance sensor 11c).

Thereafter, it is determined at S1225 if the present speed of the vehicle is in excess of a predetermined first threshold value VH. For example, a speed of 20 km per hour can be set as the first threshold value VH.

If it is determined that the present travel speed of the vehicle is lower than the first threshold value VH (No at S1225), the control unit 25 stands by for a predetermined period of time (e.g., stands by for 0.1 second) (S1230) and, thereafter, executes S1220.

On the other hand, if it is determined that the present travel speed of the vehicle is in excess of the first threshold value VH (Yes at S1225), after the rewrite permit flag is set (S1240), the rewrite safety check processing ends, and S420 is executed.

That is, if the travel speed of the vehicle is equal to or lower than the first threshold value VH, S1220 to S1230 are repetitively executed so that S420 is not effected to thereby prohibit the execution of the rewrite processing. If the present travel speed of the vehicle is in excess of the first threshold value VH, the routine shifts to S420 to permit the execution of the rewrite processing.

On the other hand, if it is determined at S1210 that the rewrite permit flag has been set (Yes at S1210), the control unit 25 specifies at S1250 the present travel speed of the vehicle like in the processing at S1220 and checks if the present travel speed of the vehicle is lower than a predetermined second threshold value VL (S1255). The second threshold value VL is set to a value smaller than the first threshold value VH (second threshold value VL<first threshold value VH). For example, a speed of 10 km per hour can be set as the second threshold value VL.

Here, if it is determined that the present travel speed of the vehicle is equal to or higher than the second threshold value VL (No at S1255), the control unit 25 ends the rewrite safety check processing while maintaining the rewrite permit flag in the set state, and executes S420.

On the other hand, if it is determined that the present travel speed of the vehicle is lower than the second threshold value VL (Yes at S1255), the rewrite permit flag is reset at S1260. Thereafter, the control unit 25 stands by for a predetermined period of time (S1270), and executes S1220.

Figure 15B:
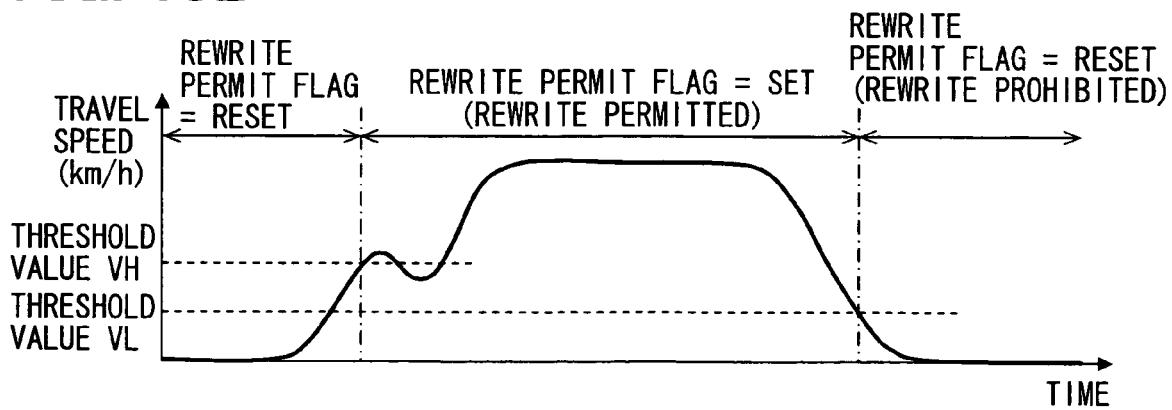
FIG. 15B is a diagram illustrating a change in a rewrite permit flag.

That is, as illustrated in FIG. 15B, if the travel speed of the vehicle has exceeded the first threshold value VH, execution of the rewrite processing is permitted until the travel speed becomes lower than the second threshold value VL. If the travel speed of the vehicle becomes lower than the second threshold value VL, execution of the rewrite processing is prohibited until the travel speed of the vehicle exceeds the first threshold value VH.

Upon executing S420, further, the control unit 25 reads the data stored in the block to be processed from the memory card 19a and temporarily stores the data that are read out in the RAM 25b.

After the end of the processing, unlike in the first embodiment, the control unit 25 does not save the data of the block to be processed in the NVRAM 25c for backing up, but starts at S440 the processing (rewrite processing) for rewriting the data of the block to be processed read for the RAM 25b into the memory card 19a from the RAM 25b (S440), and refreshes the data of the block to be processed stored in the memory card 19a.

Figure 16:
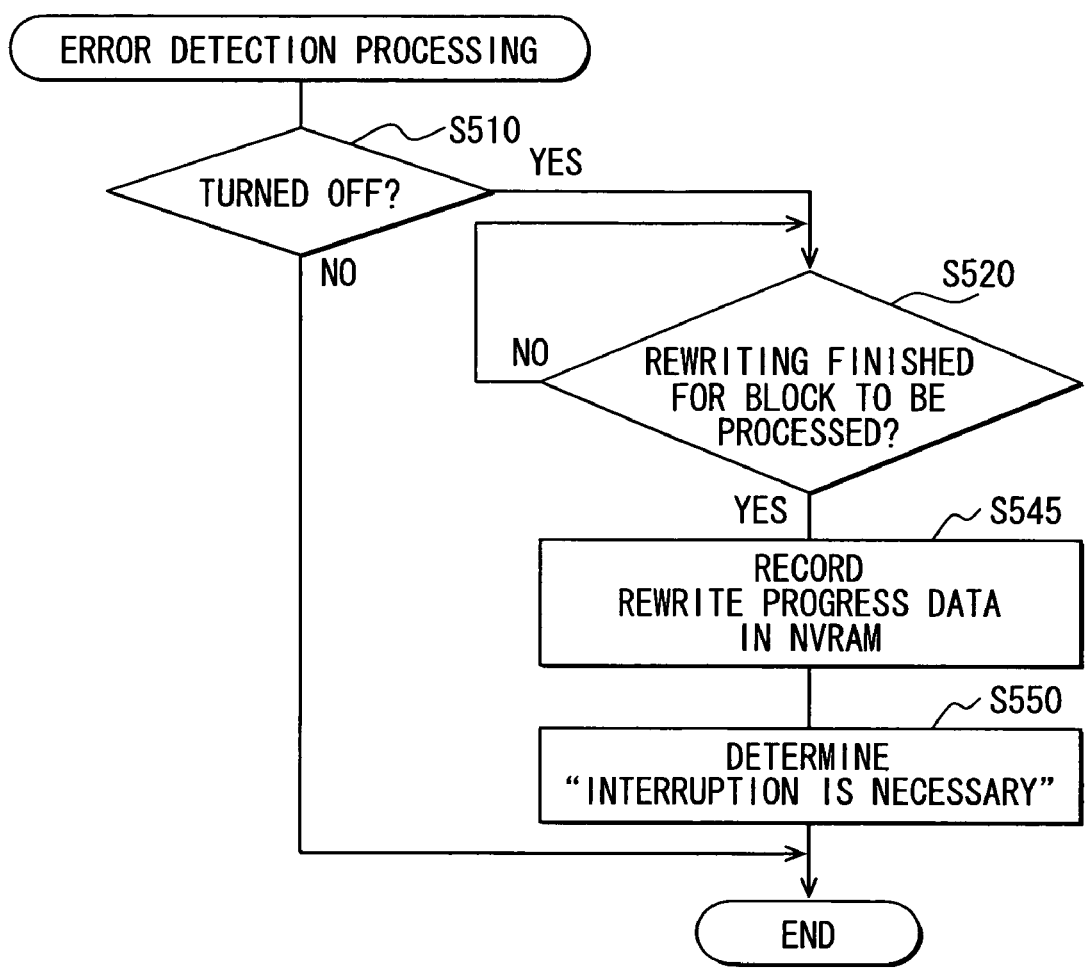
FIG. 16 is a flowchart illustrating the error detection processing according to the fifth embodiment.

After the start of the rewrite processing, the control unit 25 executes the error detection processing in parallel therewith until the rewrite processing is finished (S450). In this embodiment, however, an error detection processing illustrated in FIG. 16 is executed instead of the error detection processing illustrated in FIG. 6.

After the start of the error detection processing, the control unit 25 checks if the navigation device 1 is turned off in the same manner as in the first embodiment (S510). If it is determined that the navigation device 1 is turned off (Yes at S510), the control unit 25 executes S520.

At S520, the control unit 25 stands by until the rewrite processing ends for all of the blocks to be processed that are now being rewritten. After the end of all rewrite processing (Yes at S520), the rewrite progress data are written into the NVRAM 25c (S545). Specifically, at S545, the data of the rewrite region set when the rewrite control processing is executed and the data of the block for which the rewrite processing is completed, are recorded. After the end of the processing at S545, the control unit 25 renders the determination that "interruption is necessary" (S550) and ends the error detection processing.

On the other hand, if it is determined that the navigation device 1 has not been turned off, the control unit 25 ends the error detection processing without executing the processing of S520 to S550. Here, since the data have not been backed up at the time of executing the rewrite processing, it becomes inconvenient if the memory card 19a is removed from the card slot portion 19 during the rewrite processing.

Therefore, the card slot portion 19 is provided with a mechanism which does not permit the memory card 19a to be removed from the card slot portion 19 unless a normal procedure is taken. Namely, the navigation device 1 permits the memory card 19a to be ejected from the card slot portion 19 only when an instruction is received from the user. When the rewrite control processing is being executed, therefore, the navigation device 1 does not receive the instruction from the user.

After the end of the error detection processing at S450 as described above, it is checked if the determination "interruption is necessary" is rendered in the error detection processing like in the first embodiment (S460). If it is determined that "interruption is necessary" is rendered (Yes at S460), the rewrite control processing is interrupted without executing the processing after S470.

On the other hand, if it is determined that "interruption is necessary" is rendered in the error detection processing (No at S460), it is checked if the rewrite processing is completed for the block to be processed (S470). If it is determined that the rewrite processing has not been completed for the block to be processed (No at S470), S450 is executed.

After the completion of the rewrite processing for the block to be processed (Yes at S470), determination is rendered at S490 in the same manner as in the first embodiment. If it is determined that the rewrite processing has not been finished for all of the blocks in the rewrite region (No at S490), the block to be processed is changed to a next block (S495), and S415 is executed.

As described above, the control unit 25 executes the rewrite safety check processing for each of the blocks, and executes the rewrite processing only when the vehicle is traveling at high speeds. After the end of the rewrite processing for all of the blocks in the rewrite region (Yes at S490), the rewrite control processing ends.

Figure 17:
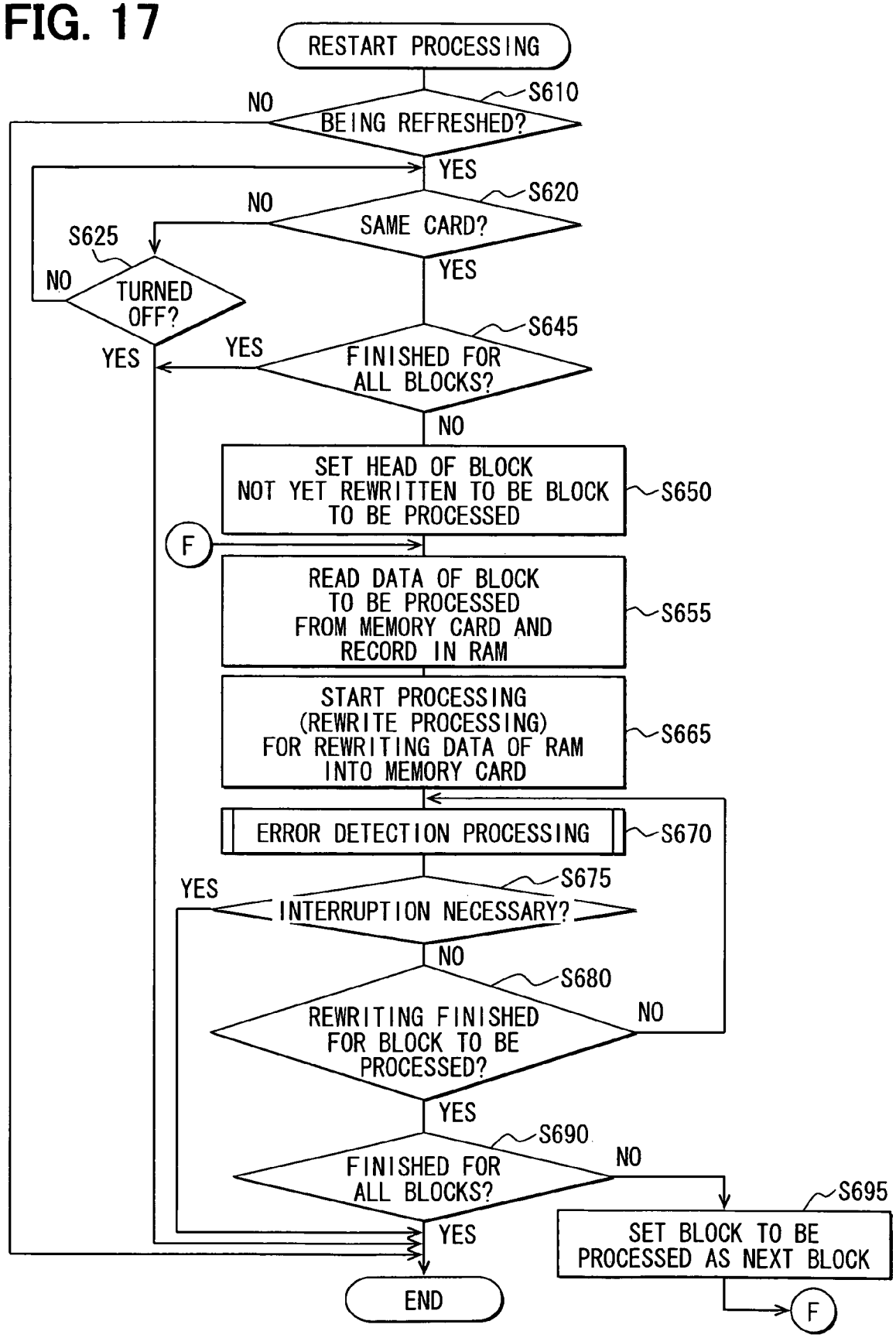
FIG. 17 is a flowchart illustrating the restart processing according to the fifth embodiment.

Further, since the rewrite control processing and the error detection processing are different from those of the first embodiment as described above, S240 in the after-start processing executes restart processing according to a procedure as illustrated in FIG. 17 omitting the processing of S630, S633, S637, S640, S660 and S685. That is, if the affirmative determination is rendered at S620, S645 is executed without executing S630 and S640. After S655 is executed, S665 is executed without executing the processing of S660. If the affirmative determination is rendered at S680, S690 is executed without executing the processing of S685.

According to the navigation device 1 of the fifth embodiment as described above, execution of the rewrite processing is prohibited if the travel speed of the vehicle is lower than the threshold value VL. Even without storing the data to be refreshed in the NVRAM 25c for backing up at the time of executing the rewrite processing, therefore, it is made possible to minimize the probability in that the rewrite processing was unsuccessful and the data in the memory card 19a were extinguished. Therefore, the navigation device 1 can be configured inexpensively.

In this embodiment, means for obtaining vehicle data is realized by the processing of S1220 and S1250, and prohibition means is realized by the steps of the rewrite safety check processing excluding S1220 and S1250.

Sixth Embodiment

The hardware configuration of the navigation device 1 of a sixth embodiment is the same as that of the navigation devices 1 of the above embodiments inclusive of the first embodiment. Described below selectively are the contents of processing realized by the control unit 25 in a software manner.

Figure 18:
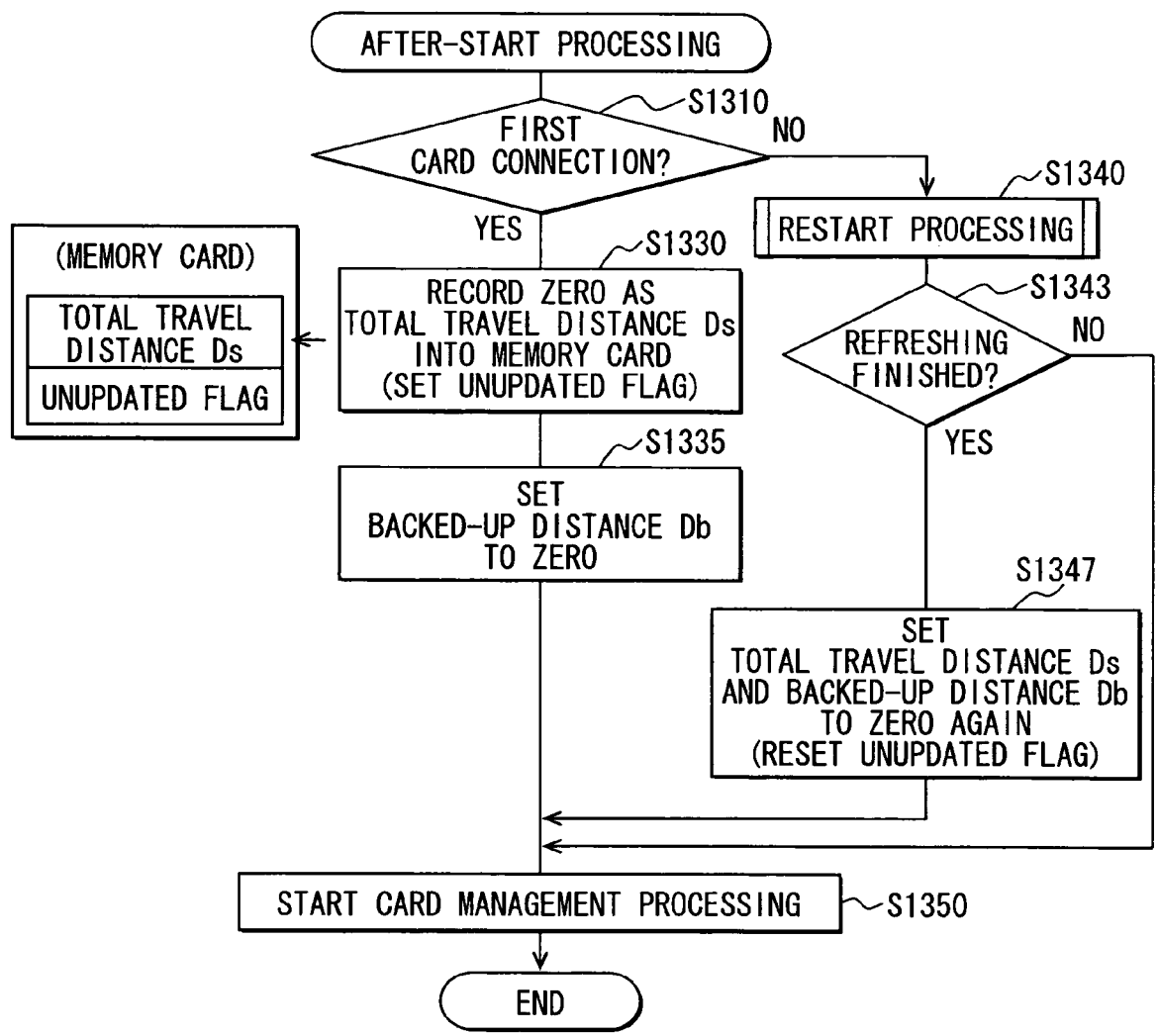
FIG. 18 is a flowchart illustrating the after-start processing according to a sixth embodiment.

This embodiment is different from the above embodiments simply with regard to the conditions for executing the refreshing operation for the memory card 19a. That is, the processing executed by the control unit 25 can be basically configured in the same manner as those of the above embodiments except the procedure resulting from different conditions for executing the rewrite control processing. For example, in the rewrite control processing, the data in the block to be processed may be backed up by the NVRAM 25c like in the first embodiment (S430). Further, the content of the rewrite processing executed at S440 is the same. Therefore, described below are differences in the procedure resulting from the difference in the conditions for execution. The control unit 25 executes an after-start processing illustrated in FIG. 18 instead of the after-start processing illustrated in FIG. 3.

Upon the start of the after-start processing, the control unit 25, first, checks if the memory card 19a connected to the card slot portion 19 is the one that is connected to the card slot portion 19 for the first time (S1310). In this embodiment, the data related to the total travel distance Ds and of the unupdated flag are recorded at S1330 in the memory card 19a that is connected for the first time. At S1310, therefore, it is checked if the data related to the total travel distance Ds and to the unupdated flag are recorded in the memory card 19*a* to thereby check if the memory card 19*a* that is connected is the one that is connected to the card slot portion 19 for the first time.

If it is determined that the memory card 19*a* is the one that is connected for the first time (Yes at S1310), the control unit 25 records the data related to the total travel distance Ds and to the unupdated flag in a predetermined region of the memory card 19*a* (S1330). At this moment, however, a value 0 is written as the total travel distance Ds to set the total travel distance Ds to the value 0, and a value 1 is recorded as a data of the unupdated flag to set the unupdated flag.

Further, a value 0 is written as a back-up distance Db into the RAM 25*b* to set the back-up distance Db stored in the RAM 25*b* to the value 0 (S1335). Here, the back-up distance Db is stored and saved in the RAM 25*b* irrespective of if the navigation device 1 is turned on or off.

Figure 19:
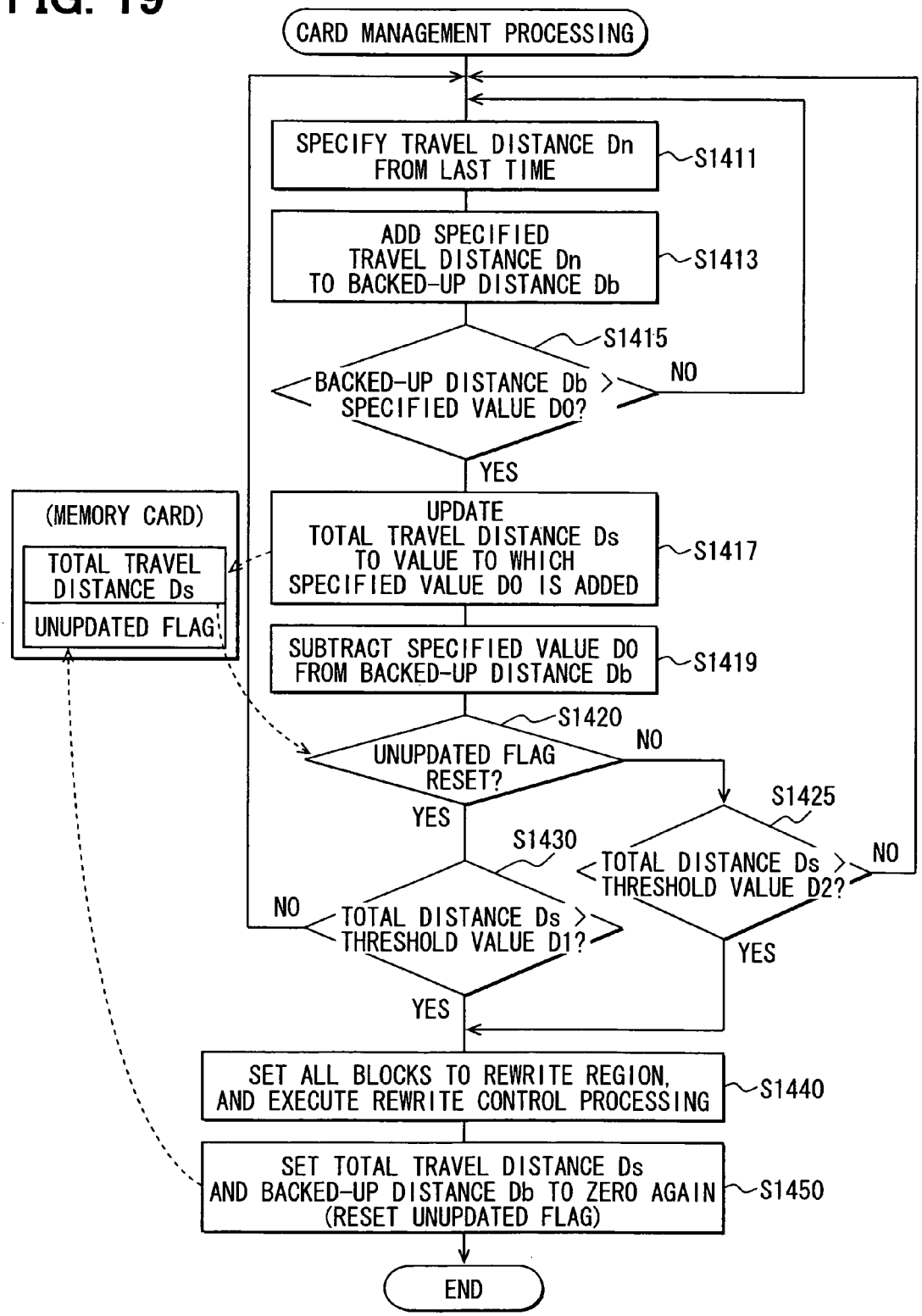
FIG. 19 is a flowchart illustrating the card management processing according to the sixth embodiment.

After the end of the processing at S1335, further, the control unit 25 starts executing the card management processing illustrated in FIG. 19 (S1350) and, thereafter ends the after-start processing. After having started the execution of the card management processing at S1350, the card management processing is repetitively executed until the end of the navigation device 1.

On the other hand, if it is determined that the memory card 19*a* connected to the card slot portion 19 is not the memory card 19*a* that is connected for the first time (No at S1310), the control unit 25 at S1340 executes the restart processing illustrated in FIG. 7.

After the end of the restart processing, the control unit 25 checks if the refreshing operation for the memory card 19*a* is completed in the immediately preceding restart processing (specifically, if the affirmative determination is rendered at S690 or S645 and if the restart processing is finished) (S1343). If it is determined that the refreshing operation is completed (Yes at S1343), the total travel distance Ds stored in the predetermined region of the memory card 19*a* is updated to a value 0 and the unupdated flag is reset. Moreover, the backed-up distance stored in the RAM 25*b* is updated to a value 0 (S1347). Thereafter, the card management processing illustrated in FIG. 19 is executed at S1350, and the after-start processing ends.

On the other hand, if the refreshing operation for the memory card 19*a* has not been completed in the restart processing (i.e., if the negative determination is rendered at S610 or if the affirmative determination is rendered at S625 or S675, and if the restart processing has been finished) (No at S1343), S1350 is executed without executing the processing of S1347. Thereafter, the card management processing illustrated in FIG. 19 is executed (S1350), and after-start processing ends. Here, however, if the affirmative determination is rendered at S625 or S675, the after-start processing ends without executing the processing of S1350, and the navigation device 1 is turned off.

The control unit 25 executes the card management processing that starts at S1350 in a manner as illustrated in FIG. 19.

Upon the start of the card management processing, the control unit 25, first, specifies at S1411 the distance Dn which the vehicle has traveled from the point of last execution at S1411. After the navigation device 1 has been started and when S1411 is executed for the first time, however, the control unit 25 specifies the distance Dn which the vehicle has traveled from the moment of start of the navigation device 1.

For example, at the start of the navigation device 1, the task is driven for measuring the travel distance from the moment of start based on a signal detected by the position detector 11 and, at S1411, the travel distance Dn is specified by finding a difference between the travel distance measured by the task at the moment of the last execution at S1411 and the distance traveled this time.

After the end of the processing at S1411, the control unit 25 updates at S1413 the backed-up distance Db stored in the RAM 25*b* to a value (Db+Dn) obtained by adding the travel distance Dn specified at S1411 to the present value (Db←Db+Dn). Thereafter, it is checked if the distance Db backed up after the updating is exceeding a specified value D0 (e.g., 100 km) that has been determined in advance in the stage of designing (S1415).

If it is determined at S1415 that the distance that is backed up is equal to or smaller than the specified value D0 (No at S1415), the control unit 25 at S1411 repetitively executes the processing for updating the backed-up distance Db until the backed-up distance exceeds the specified value D0 (S1411 to S1415).

If the distance that is backed up exceeds the specified value D0 (Yes at S1415), the control unit 25 at S1417 makes an access to the memory card 19*a* connected to the card slot portion 19, and updates the total travel distance Ds stored in the memory card 19*a* to a value (Ds+D0) to which the above specified value D0 is added (Ds←Ds+D0).

Further, after the end of the processing at S1417, the control unit 25 at S1419 updates the backed-up distance Db stored in the RAM 25*b* to a value obtained by subtracting the specified value D0 from the present value (Db←Db−D0).

The total travel distance Ds is updated for each specified value D0 from the standpoint of decreasing the frequency of access (frequency of writing the data) to the memory card 19*a*. As described above, if the frequency of access to the memory card 19*a* increases, the retention decreases. Therefore, a decrease of retention is suppressed by updating the total travel distance Ds in a manner as described above.

After the processing at S1419, further, reference is made to the unupdated flag stored in the memory card 19*a* and it is checked if the unupdated flag has been reset (S1420). If it is determined that the unupdated flag has been reset (Yes at S1420), S1430 is executed.

Thereafter, it is determined at S1430 if the total travel distance Ds after updated at S1417 has exceeded the threshold value D1. If it is determined that the total travel distance Ds after updated is not in excess of the threshold value D1 (No at S1430), S1411 is executed. Thus, if the unupdated flag is in the reset state, the control unit 25 updates the backed-up distance Db and the total travel distance Ds until the total travel distance Ds exceeds the threshold value D1 according to the above procedure.

On the other hand, if it is determined that the total travel distance Ds after updated is in excess of the threshold value D1 (Yes at S1430), the control unit 25 at S1440 sets all of the blocks in the memory card 19*a* to the rewrite region that is to be refreshed, and executes the rewrite control processing illustrated in FIG. 5 (S1440).

After the end of the rewrite processing for all of the blocks and, therefore, after the end of the rewrite control processing, the total travel distance Ds stored in the memory card 19*a* is updated to a value 0, the backed-up distance Db is updated to a value 0 (S1450), and the card management processing once ends. Thereafter, the card management processing starts again from S1411.

On the other hand, if it is determined at S1420 that the unupdated flag stored in the memory card 19*a* is in the set state (No at S1420), the control unit 25 determines at S1425 if the total travel distance Ds after updated at S1417 is exceeding a threshold value D2.

Here, the threshold value D2 has been set in advance to a value smaller than the threshold value D1. Specifically, the following relationship D1>D2>D0 holds among the threshold value D1, threshold value D2 and specified value D0. Here, the threshold value D1 and the threshold value D2 may be determined in the stage of designing by taking the retention into consideration.

If it is determined at S1425 that the total travel distance Ds after updated is not in excess of the threshold value D2 (No at S1425), S1411 is executed. Thus, if the unupdated flag is in the set state, the control unit 25 updates the backed-up distance Db and the total travel distance Ds according to the above procedure until the total travel distance Ds exceeds the threshold value D2.

If it is determined that the total travel distance Ds after having been updated is in excess of the threshold value D2 (Yes at S1425), the control unit 25 executes the processing of S1440 and, further, executes the processing of S1450. If the determination is rendered at S1425, however, the unupdated flag is in the set state. At S1450, therefore, the unupdated flag in the set state stored in the memory card 19a is updated to be reset. Thereafter, the control unit 25 once ends the card management processing and starts the card management processing again from S1411.

According to the navigation device 1 of this embodiment, the rewrite control processing is executed depending upon the distance which the vehicle has traveled from the moment the data are written into the memory card 19a (S1440), and the whole data in the memory card 19a are refreshed.

According to the navigation device 1, therefore, the data in the memory card 19a are prevented from being volatilized, and the navigation device 1 is prevented from erroneously operating due to the volatilization of data.

Namely, the navigation device 1 furnishes passengers of a vehicle with information necessary for traveling the vehicle. Therefore, a correlation exists between the distance the vehicle has traveled and the frequency of access to the memory card 19a storing the data (inclusive of programs) necessary for the navigation device 1.

Therefore, even by refreshing the data in the memory card 19a based on the travel distance, the refreshing operation can be executed at a suitable timing, and the navigation device 1 can be prevented from erroneously operating due to the volatilization of data. Further, the above function can be easily realized by using a software.

Further, the navigation device 1 may be so configured as to record the total time of use in the memory card 19a instead of recording the total travel distance Ds.

That is, at S1411, the passage of time from when S1411 was executed last time is specified instead of specifying the travel distance Dn. Here, however, the passage of time from the start of the navigation device is specified in the first time only after the start of the navigation device 1.

The passage of time is added to the backed-up time which the RAM 25b is storing instead of storing the backed-up distance Db. Upon repetitively executing the above operation (S1411 to S1413), the total time of use stored in the memory card is updated to a value to which the specified time is added (S1417) at a moment when the backed-up time has exceeded the specified time (Yes at S1415). Further, the specified time is subtracted from the backed-up time (S1419).

Next, while varying the threshold value depending upon the state of the unupdated flag, it is checked if the total time of use is in excess of the threshold value (S1420 to S1430). If the total time of use is not exceeding, S1411 is executed. If the total time of use is in excess of the threshold value, the processing of S1440 is executed to refresh the data in the memory card 19a. After refreshed, the total time of use stored in the memory card 19a is reset to zero, the backed-up distance stored in the RAM 25b is reset to zero and, further, the unupdated flag is reset.

Even by thus configuring the navigation device 1, the refreshing operation can be executed at a suitable timing, and the navigation device 1 is prevented from being erroneously operated by the volatilization of data.

The function of the travel distance estimation means of this embodiment is realized by the processing of S1417 for updating the total travel distance Ds of this embodiment or the like, and the function of update control means is realized by the processing of S1420 to S1430.

Similarly, the function of operation time estimation means is realized by the operation for updating the total time of use, and the function of update control means is realized by the operation for changing over the processing by comparing the total time of use with the threshold value (S1420 to S1430).

Though the invention was described above by way of the first to sixth embodiments, it should be noted that the invention can assume various embodiments without being limited to the above embodiments only.

For example, in refreshing the data in the memory card 19a, the refreshing operation (data updating operation) can be realized even by writing the data that are read out into another block and erasing the data of the block from which the data were read out. In this case, though the data management becomes complex, memory cells in the memory card 19a can be evenly used, and the life of the memory card 19a can be lengthened.

At S430 and S660, further, the data of the block to be processed may be backed up in a particular region of the memory card 19a. Similarly, the rewrite progress data, too, may be recorded in the memory card 19a.

As for setting the threshold values T1 and T2 in the card management processing, further, the threshold values T1 and T2 are desirably set by taking into consideration the passage of time after which the probability of data destruction becomes higher than a predetermined value, the frequency of writing data after which the probability of data destruction becomes higher than a predetermined value, and the guarantee period of the product.

For example, if the passage of time after which the probability of data destruction increases is one year and the frequency of writing data into the memory cells after which the probability of data destruction increases is 20 times, then the threshold value T1 should be set to be from 0.5 year to one year if the period for guaranteeing the product is to be set to 10 years. Further, if the passage of time after which the probability of data destruction increases is 0.1 year and the frequency of writing data into the memory cells after which the probability of data destruction increases is 100 times, then the threshold value T1 should be set to be about 0.1 year if the period for guaranteeing the product is to be set to 10 years.

Further, to minimize the decrease of retention caused by high temperatures, it is desired that the navigation device 1 is installed at a position where the memory card 19a is not exposed to high temperatures. It is, further, more desired to contrive a heat-radiating structure for the navigation device 1 by providing a heat-insulating material or a fan around the navigation device 1.

In the third embodiment, further, the temperature sensor may not be provided in the card slot portion 19 but, instead, the steps may be executed in the high-temperature time estimation processing based on the external air temperature sensor mounted on the vehicle.

In the first and second embodiments, further, the read counter CN may be provided for a unit of a predetermined number of blocks.

As for obtaining the present date and hour as described above, further, it is possible, as is well known, to grasp the absolute time based on the signals transmitted from the GPS satellites. When the present invention is to be applied to the navigation device, the data related to the present date and hour may be obtained through a GPS receiver. Further, an internal timepiece of the electronic device may be regularly adjusted based on the time data obtained through the GPS receiver, and the date and hour of writing data may be recorded in the memory card 19*a* relying on the internal timepiece.

Moreover, the electronic device may be provided with a timepiece function, and the time may be adjusted, as required, on the user side. Or, the time counted by the internal timepiece of the electronic device may be adjusted based on another timepiece possessed by the vehicle. Further, the electronic device may be provided with a communication function, and the time data may be obtained via an external network to adjust the time counted by the internal timepiece of the electronic device.

What is claimed is:

1. An electronic device connectable to an electrically data-rewritable nonvolatile memory, in which predetermined data have been written in advance, for executing processing based on the data stored in the nonvolatile memory, comprising:
   storage means capable of temporarily storing the data stored in the nonvolatile memory;
   data updating means for updating the data stored in the nonvolatile memory by executing data update processing of reading out the data stored in the nonvolatile memory from the nonvolatile memory and storing the data read out from the nonvolatile memory in the storage means, and rewriting the data stored in the storage means into the nonvolatile memory;
   after-writing time passage estimation means for estimating the passage of time after writing which is the passage of time after a moment the data stored in the nonvolatile memory are written into the nonvolatile memory;
   update control means for having the data updating means execute the data update processing every time when the passage of time after writing estimated by the after-writing time passage estimation means exceeds a threshold value; and
   a slot portion to which a memory card including the nonvolatile memory is detachably connectable, the electronic device being connectable to the memory card via the slot portion to execute the processing based on the data stored in the nonvolatile memory included in the memory card,
   wherein the after-writing time passage estimation means estimates the passage of time from a moment the data update processing is executed by the data updating means, as the passage of time after writing, and
   wherein, if the data update processing has not been executed in the past for the nonvolatile memory included in the memory card, the after-writing time passage estimation means estimates the passage of time from a moment the memory card was connected for the first time to the slot portion, as the passage of time after writing.

2. The electronic device according to claim 1, wherein:
   the data updating means writes the data of present date and hour into the nonvolatile memory as the data of date and hour of writing data when the data update processing is executed; and
   the after-writing time passage estimation means estimates the passage of time from the date and hour of writing data and stored in the nonvolatile memory, as the passage of time after writing.

3. The electronic device according to claim 1, wherein:
   the update control means has the data updating means execute the data update processing at a moment when the passage of time after writing estimated by the after-writing time passage estimation means exceeds the first threshold value, if the data update processing has been executed for the nonvolatile memory in the past, and
   the update control means has the data updating means execute the data update processing at a moment when the passage of time after writing estimated by the after-writing time passage estimation means exceeds a second threshold value which is smaller than the first threshold value, if the data update processing has not been executed for the nonvolatile memory in the past.

4. The electronic device according to claim 1, further comprising:
   high-temperature time estimation means for estimating time in which the nonvolatile memory is placed in a high-temperature environment of higher than a predetermined temperature,
   wherein the update control means has the data updating means execute the data update processing every time when the time estimated by the high-temperature estimation means exceeds a threshold value.

5. The electronic device according to claim 1, further comprising:
   read frequency counting means for counting a frequency of reading the data stored in the nonvolatile memory for each unit data, which is the number of times the unit data are read out from the nonvolatile memory,
   wherein, based on a result counted by the read frequency counting means, the update control means specifies the unit data of which the read frequency has exceeded the threshold value to be the data to be processed every time when the frequency of reading the unit data has exceeded the threshold value, and has the data updating means execute the data update processing,
   wherein, if the data to be processed are specified by the update control means, the data updating means executes processing for selectively reading, from the nonvolatile memory, the data to be processed specified by the update control means among the data stored in the nonvolatile memory, storing the data read out from the nonvolatile memory in the storage means, and rewriting the data stored in the storage means into the nonvolatile memory as the data update processing.

6. The electronic device according to claim 1, wherein:
   the update control means specifies the unit data of which the reading frequency has exceeded the threshold value to be the data to be processed every time when the reading frequency has exceeded the threshold value but only for those preset unit data to be monitored among the group of unit data forming the data stored in the nonvolatile memory; and
   the update control means has the data updating means execute the data update processing, and for those unit data that have not been set to be monitored, specifies the unit data of which the reading frequency has exceeded the threshold value to be the data to be processed every time when the reading frequency has exceeded the threshold value, but does not have the data updating means execute the data update processing.

7. The electronic device according to claim 6, wherein the electronic device includes:
- a map display device for displaying a map screen that displays a map around a present position based on map data stored in the nonvolatile memory, the map display device having a function for guiding, through the map screen, the data of a point registered through a user interface; and
- a monitor object setting means for setting a monitor object to the update control means based on the data of the point registered through the user interface.

8. The electronic device according to claim 1, further comprising:
- read control means which, upon input of a read instruction, reads out the data specified by the read instruction and outputs the data that are read out to a source from where the read instruction is issued;
- total read frequency counting means for counting the total frequency of reading the data stored in the nonvolatile memory, which is the number of times the unit data are read by the read control means for each unit data; and
- copy data-forming means for storing and holding part of the data among the data stored in the nonvolatile memory in a particular region of the storage means based on the result counted by the total read frequency counting means,
- wherein the read control means reads out the data specified by the read instruction from the particular region of the storage means if the data specified by the read instruction have been stored and held in the particular region of the storage means by the operation of the copy data-forming means, and reads out the data specified by the read instruction from the nonvolatile memory if the data specified by the read instruction have not been stored and held in the particular region of the storage means by the operation of the copy data-forming means.

9. The electronic device according to claim 1, wherein:
- as for data of a particular kind, same data have been written in a plurality of numbers in the nonvolatile memory in advance; and
- the electronic device further comprises data repairing means which, if any one of the particular kind of data present in a plurality of numbers becomes abnormal, repairs the particular kind of data that became abnormal based on the same data that are not abnormal among the particular kind of data present in the plurality of number.

10. The electronic device according to claim 1, further comprising:
- vehicle data-obtaining means for obtaining data representing operating condition of a vehicle in which the electronic device is mounted; and
- prohibition means for prohibiting execution of the data update processing by the data updating means for a period in which the operating condition of the vehicle satisfies predetermined conditions based on the data representing the operating condition of the vehicle obtained by the vehicle data-obtaining means.

11. The electronic device according to claim 10, wherein:
the vehicle data-obtaining means obtains data representing a travel speed of the vehicle as the data representing the operating condition of the vehicle.

12. The electronic device according to claim 11, wherein:
the prohibition means prohibits the execution of the data update processing by the data updating means for a period in which the travel speed of the vehicle is lower than a threshold value, as a period in which the operating condition of the vehicle satisfies the predetermined conditions based on the data representing the travel speed of the vehicle obtained by the vehicle data-obtaining means.

13. The electronic device according to claim 1, further comprising:
- travel distance estimation means for estimating a distance traveled by a vehicle from a moment when the data stored in the nonvolatile memory are written into the nonvolatile memory,
- wherein the update control means has the data updating means execute the data update processing every time when the travel distance estimated by the travel distance estimation means exceeds a threshold value.

14. The electronic device according to claim 1, further comprising:
- operation time estimation means for estimating an operation time of the electronic device from a moment when the data stored in the nonvolatile memory are written into the nonvolatile memory,
- wherein the update control means has the data updating means execute the data update processing every time when the operation time estimated by the operation time estimation means exceeds a threshold value.

15. An electronic device mounted on a vehicle and connectable to an electrically data-rewritable nonvolatile memory, in which predetermined data have been written in advance, for executing processing based on the data stored in the nonvolatile memory, comprising:
- storage means capable of temporarily storing the data stored in the nonvolatile memory;
- data updating means for updating the data stored in the nonvolatile memory by executing data update processing of reading out the data stored in the nonvolatile memory from the nonvolatile memory and storing the data read out from the nonvolatile memory in the storage means, and rewriting the data stored in the storage means into the nonvolatile memory;
- travel distance estimation means for estimating a distance traveled by the vehicle from a moment when the data stored in the nonvolatile memory are written into the nonvolatile memory; and
- update control means which has the data updating means execute the data update processing every time when the travel distance estimated by the travel distance estimation means exceeds a threshold value.

16. An electronic device connectable to an electrically data-rewritable nonvolatile memory, in which predetermined data have been written in advance, for executing processing based on the data stored in the nonvolatile memory, comprising:
- storage means capable of temporarily storing the data stored in the nonvolatile memory;
- data updating means for updating the data stored in the nonvolatile memory by executing data update processing of reading out the data stored in the nonvolatile memory from the nonvolatile memory and storing the data read out from the nonvolatile memory in the storage means, and rewriting the data stored in the storage means into the nonvolatile memory;
- after-writing time passage estimation means for estimating the passage of time after writing which is the passage of time after a moment the data stored in the nonvolatile memory are written into the nonvolatile memory;
- update control means for having the data updating means execute the data update processing every time when the passage of time after writing estimated by the after-writing time passage estimation means exceeds a threshold value; and travel distance estimation means for estimating a distance traveled by a vehicle from a moment when the data stored in the nonvolatile memory are written into the nonvolatile memory, wherein the update control means has the data updating means execute the data update processing every time when the travel distance estimated by the travel distance estimation means exceeds a threshold value.

17. An electronic device connectable to an electrically data-rewritable nonvolatile memory, in which predetermined data have been written in advance, for executing processing based on the data stored in the nonvolatile memory, comprising:

storage means capable of temporarily storing the data stored in the nonvolatile memory;

data updating means for updating the data stored in the nonvolatile memory by executing data update processing of reading out the data stored in the nonvolatile memory from the nonvolatile memory and storing the data read out from the nonvolatile memory in the storage means, and rewriting the data stored in the storage means into the nonvolatile memory;

high-temperature time estimation means for estimating time in which the nonvolatile memory is placed in a high-temperature environment of higher than a predetermined temperature;

update control means for having the data updating means execute the data update processing every time when the time estimated by the high-temperature time estimation means exceeds a threshold value; and travel distance estimation means for estimating a distance traveled by a vehicle from a moment when the data stored in the nonvolatile memory are written into the nonvolatile memory, wherein the update control means has the data updating means execute the data update processing every time when the travel distance estimated by the travel distance estimation means exceeds a threshold value.

* * * * *